(12) United States Patent
Noh

(10) Patent No.: US 12,414,398 B2
(45) Date of Patent: Sep. 9, 2025

(54) IMAGE SENSOR

(71) Applicant: SAMSUNG ELECTRONICS CO., LTD., Suwon-si (KR)

(72) Inventor: Hyunpil Noh, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 556 days.

(21) Appl. No.: 17/743,765

(22) Filed: May 13, 2022

(65) Prior Publication Data
US 2023/0083953 A1    Mar. 16, 2023

(30) Foreign Application Priority Data
Sep. 10, 2021   (KR) .................. 10-2021-0121208

(51) Int. Cl.
*H10F 39/00*    (2025.01)
(52) U.S. Cl.
CPC ....... *H10F 39/807* (2025.01); *H10F 39/8023* (2025.01); *H10F 39/8053* (2025.01); *H10F 39/8063* (2025.01)
(58) Field of Classification Search
None
See application file for complete search history.

(56) References Cited

U.S. PATENT DOCUMENTS

| | | |
|---|---|---|
| 9,123,834 B2 | 9/2015 | Fujii |
| 9,893,123 B2 | 2/2018 | Lee et al. |
| 11,121,163 B2 | 9/2021 | Kim |
| 2008/0042170 A1 | 2/2008 | Han |
| 2014/0077271 A1* | 3/2014 | Fujii ............ H10F 39/8033 438/59 |
| 2017/0170239 A1* | 6/2017 | Lee ............ H10F 39/802 |
| 2020/0381473 A1 | 12/2020 | Kim et al. |
| 2020/0403025 A1 | 12/2020 | Kim et al. |
| 2021/0136310 A1 | 5/2021 | Uchida |

FOREIGN PATENT DOCUMENTS

| | | |
|---|---|---|
| JP | 2011-155248 | 8/2011 |
| KR | 10-0792334 A | 2/2008 |
| KR | 10-2020-0105197 A | 9/2020 |

OTHER PUBLICATIONS

Office Action dated Jun. 17, 2025 issued in corresponding Korean Patent Application No. 10-2021-0121208.

* cited by examiner

*Primary Examiner* — Bo B Jang
(74) *Attorney, Agent, or Firm* — Morgan, Lewis & Bockius LLP

(57) ABSTRACT

An image sensor includes a substrate having a plurality of pixel sections. The substrate has first and second surfaces that are opposite to each other. A photoelectric conversion region is in each of the pixel sections. A first isolation pattern is disposed in the substrate and is positioned between the pixel sections. A gate electrode is on the photoelectric conversion region. A lower portion of the gate electrode is inserted into the substrate. An upper portion of the gate electrode protrudes beyond the first surface of the substrate. A floating diffusion region is on the photoelectric conversion region. The floating diffusion region is positioned on one side of the gate electrode. The floating diffusion region includes a doping pad and a first impurity region. The first impurity region surrounds a lower portion of the doping pad. The doping pad is horizontally spaced apart from the first isolation pattern.

20 Claims, 21 Drawing Sheets

IMAGE SENSOR

CROSS-REFERENCE TO RELATED APPLICATION

This application claims priority under 35 U.S.C § 119 to Korean Patent Application No. 10-2021-0121208, filed on Sep. 10, 2021 in the Korean Intellectual Property Office, the disclosure of which is incorporated by reference in its entirety herein.

1. TECHNICAL FIELD

The present disclosure relates to an image sensor, and more particularly, to a complementary metal oxide semiconductor (CMOS) image sensor.

2. DISCUSSION OF RELATED ART

An image sensor is a semiconductor device that transforms optical images into electrical signals. Recent advances in the computer and communication industries have led to strong demands for high performances image sensors in various types of consumer electronic devices, such as digital cameras, camcorders, PCSs (Personal Communication Systems), game devices, security cameras, medical micro cameras, etc. An image sensor can be classified into a charge coupled device (CCD) type and a complementary metal oxide semiconductor (CMOS) type. A CMOS type image sensor (CIS) has a plurality of two-dimensionally arranged pixels. Each of the pixels includes a photodiode (PD). The photodiode transforms an incident light into an electrical signal. The plurality of pixels are defined by a deep isolation pattern disposed therebetween.

SUMMARY

Some embodiments of the present inventive concept relate to an image sensor that prevents gate induced drain leakage (GIDL) phenomena and a method of fabricating the same.

According to an embodiment of the present inventive concept, an image sensor includes a substrate having a plurality of pixel sections. The substrate has first and second surfaces that are opposite to each other. A photoelectric conversion region is in each of the pixel sections. A first isolation pattern is disposed in the substrate and is positioned between the pixel sections. A gate electrode is on the photoelectric conversion region. A lower portion of the gate electrode is inserted into the substrate. An upper portion of the gate electrode protrudes beyond the first surface of the substrate. A floating diffusion region is on the photoelectric conversion region. The floating diffusion region is positioned on one side of the gate electrode. The floating diffusion region includes a doping pad and a first impurity region. The first impurity region surrounds a lower portion of the doping pad. The doping pad is horizontally spaced apart from the first isolation pattern.

According to an embodiment of the present inventive concept, an image sensor includes a substrate having a first surface and a second surface that are opposite to each other. A first isolation pattern is disposed in the substrate. The first isolation pattern defines a pixel section. A photoelectric conversion region is in the pixel section. A gate electrode is on the photoelectric conversion region. A floating diffusion region is on the photoelectric conversion region. The floating diffusion region is positioned on one side of the gate electrode. The floating diffusion region includes an impurity region and a doping pad disposed on the impurity region. The doping pad is horizontally spaced apart from the first isolation pattern. A bottom surface of the doping pad is positioned at a level that is lower than a level of the first surface of the substrate.

According to an embodiment of the present inventive concept, an image sensor includes a substrate that has a first surface and a second surface that are opposite to each other. The substrate includes a first trench that is recessed from the first surface of the substrate. A first isolation pattern is in the substrate. The first isolation pattern defines a pixel section. A second isolation pattern is in the first trench. A photoelectric conversion region is in the pixel section. A gate electrode is on the second isolation pattern. A floating diffusion region is on the photoelectric conversion region. The floating diffusion region is positioned on one side of the gate electrode. The floating diffusion region includes an impurity region and a doping pad on the impurity region. A contact plug is on the first surface of the substrate and is electrically connected to the doping pad. A microlens is on the second surface of the substrate. A plurality of color filters is between the substrate and the microlens. A portion of a sidewall of the doping pad directly contacts the second isolation pattern.

DETAILED DESCRIPTION OF EMBODIMENTS

Some embodiments of the present inventive concept will now be described in detail with reference to the accompanying drawings to aid in clearly explaining the present inventive concept.

Figure 1:
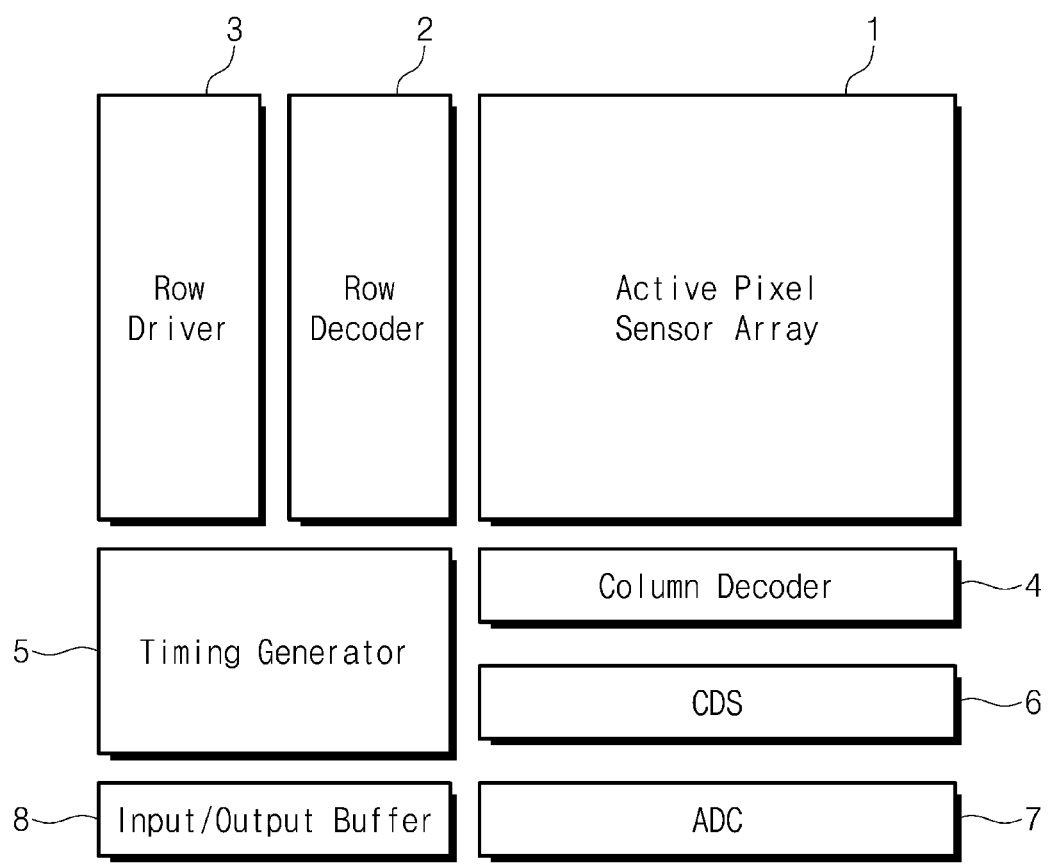
FIG. 1 illustrates a simplified block diagram showing an image sensor according to an embodiment of the present inventive concept.

FIG. 1 illustrates a simplified block diagram showing an image sensor according to an embodiment of the present inventive concept.

Referring to FIG. 1, an image sensor may include an active pixel sensor array 1, a row decoder 2, a row driver 3, a column decoder 4, a timing generator 5, a correlated double sampler (CDS) 6, an analog-to-digital converter (ADC) 7, and an input/output buffer 8.

In an embodiment, the active pixel sensor array 1 may include a plurality of two-dimensionally arranged pixels. Each of the two-dimensionally arranged pixels may be configured to convert optical signals into electrical signals. The active pixel sensor array 1 may be driven by a plurality of driving signals, such as a pixel selection signal, a reset signal, and a charge transfer signal, which are provided from the row driver 3. In addition, the correlated double sampler 6 may be provided with the electrical signals which are converted by the active pixel sensor array 1.

The row driver 3 may provide the active pixel sensor array 1 with several driving signals for driving several pixels in accordance with a decoded result obtained from the row decoder 2. In an embodiment in which the plurality of pixels are arranged in a matrix shape, the driving signals may be provided for each row.

The timing generator 5 may provide timing and control signals to the row decoder 2 and the column decoder 4.

The correlated double sampler 6 may receive the electrical signals generated from the active pixel sensor array 1, and may hold and sample the received electrical signals. In an embodiment, the correlated double sampler 6 may perform a double sampling operation to sample a specific noise level and a signal level of the electrical signal, and then may output a difference level corresponding to a difference between the noise and signal levels.

The analog-to-digital converter 7 may convert analog signals, which correspond to the difference level received from the correlated double sampler 6, into digital signals and then output the converted digital signals.

The input/output buffer 8 may latch the digital signals and then sequentially output the latched digital signals to an image signal processing unit in response to the decoded result obtained from the column decoder 4.

Figure 2:
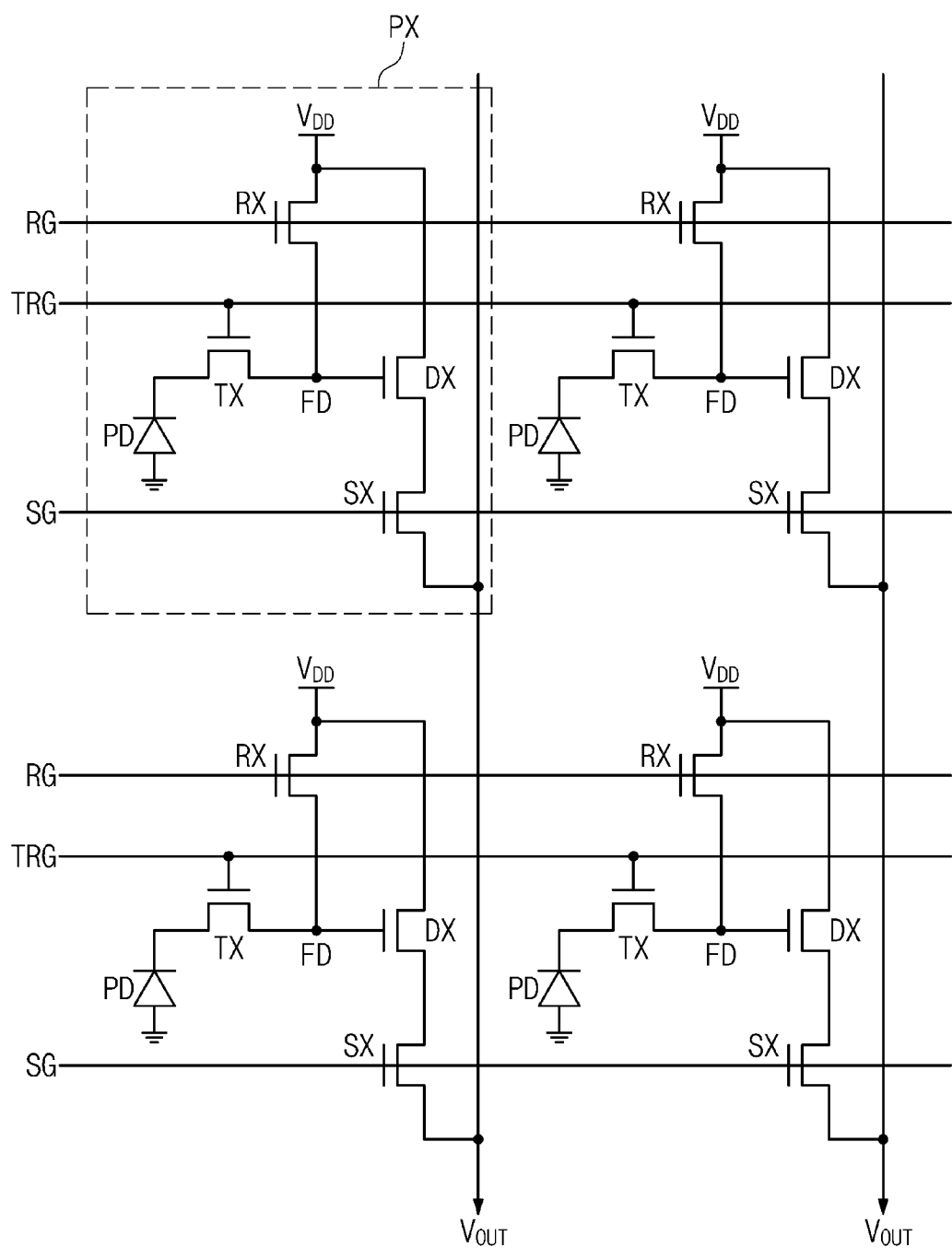
FIG. 2 illustrates a circuit diagram showing an active pixel sensor array of an image sensor according to an embodiment of the present inventive concept.

FIG. 2 illustrates a circuit diagram showing an active pixel sensor array of an image sensor according to some embodiments of the present inventive concept.

Referring to FIGS. 1 and 2, in an embodiment, the active pixel sensor array 1 may include a plurality of pixel sections PX, and the pixel sections PX may be arranged in a matrix shape. Each of the pixel sections PX may include a transfer transistor TX and logic transistors. The logic transistors may include a reset transistor RX, a selection transistor SX, and a drive transistor DX. The transfer transistor TX, the reset transistor RX, and the selection transistor SX may respectively include a transfer gate TRG, a reset gate RG, and a selection gate SG. Each of the pixel sections PX may further include a photoelectric conversion element PD and a floating diffusion region FD.

The photoelectric conversion element PD may create and accumulate photo-charges in proportion to an amount of externally incident light. In an embodiment, the photoelectric conversion element PD may be a photodiode including a p-type impurity region and an n-type impurity region. The transfer transistor TX may transfer charges generated in the photoelectric conversion element PD into the floating diffusion region FD. The floating diffusion region FD may accumulate and store the charges generated and transferred from the photoelectric conversion element PD. The drive transistor DX may be controlled by an amount of photo-charges accumulated in the floating diffusion region FD.

The reset transistor RX may periodically reset the charges accumulated in the floating diffusion region FD. The reset transistor RX may have a drain electrode connected to the floating diffusion region FD and a source electrode connected to a power voltage $V_{DD}$. When the reset transistor RX is turned on, the floating diffusion region FD may be supplied with the power voltage $V_{DD}$ connected to the source electrode of the reset transistor RX. Accordingly, when the reset transistor RX is turned on, the charges accumulated in the floating diffusion region FD may be exhausted and thus the floating diffusion region FD may be reset.

The drive transistor DX may serve as a source follower buffer amplifier. The drive transistor DX may amplify a variation in electrical potential of the floating diffusion region FD and may output the amplified electrical potential to an output line $V_{OUT}$.

The selection transistor SX may select each row of the pixel sections P to be readout. When the selection transistor SX is turned on, the power voltage $V_{DD}$ may be applied to a drain electrode of the drive transistor DX.

FIG. 2 depicts by way of example a unit pixel section PX that includes one photoelectric conversion element PD and four transistors, such as the transfer transistor TX, the reset transistor RX, the drive transistor DX, and the selection transistor SX. However, the image senor according embodiments of the present inventive concept are not necessarily limited thereto. For example, in an embodiment, neighboring pixel sections PX may share the reset transistor RX, the drive transistor DX, or the selection transistor SX. Therefore, the image sensor may increase in integration.

Figure 3:
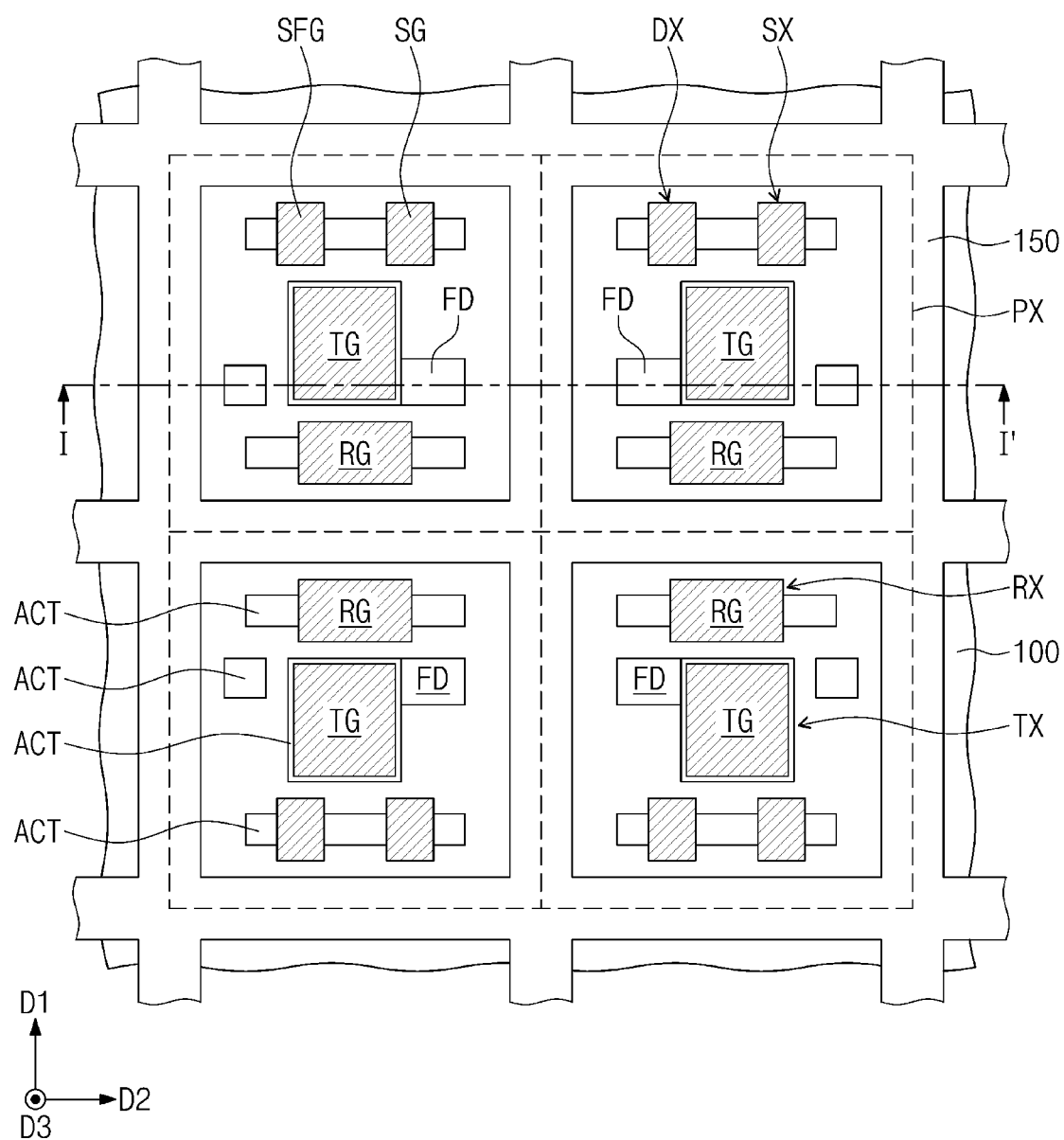
FIG. 3 illustrates a plan view showing an image sensor according to an embodiment of the present inventive concept.
Figure 4:
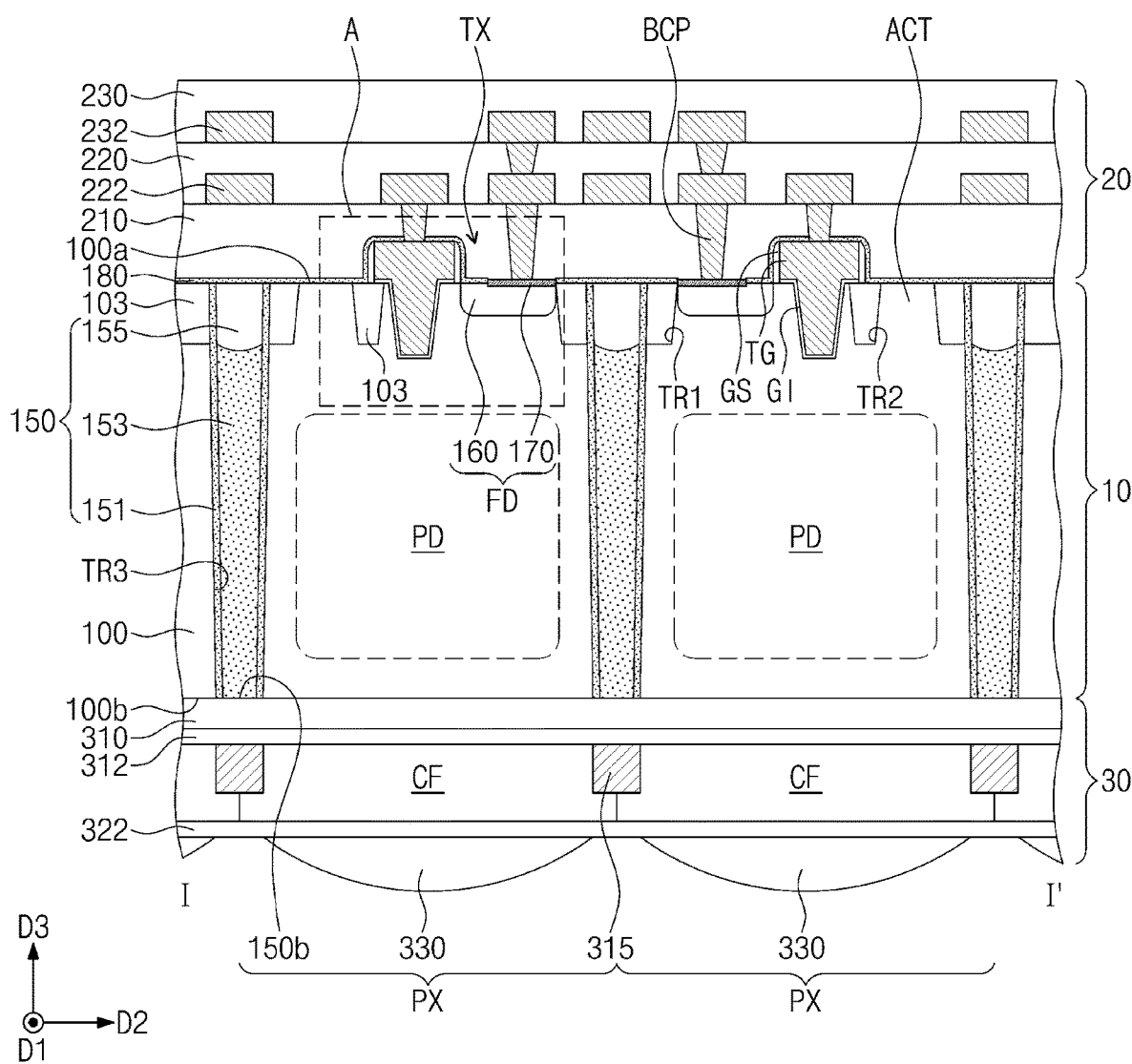
FIG. 4 illustrates a cross-sectional view of an image sensor taken along line I-I' of FIG. 3, according to an embodiment of the present inventive concept.
Figure 5:
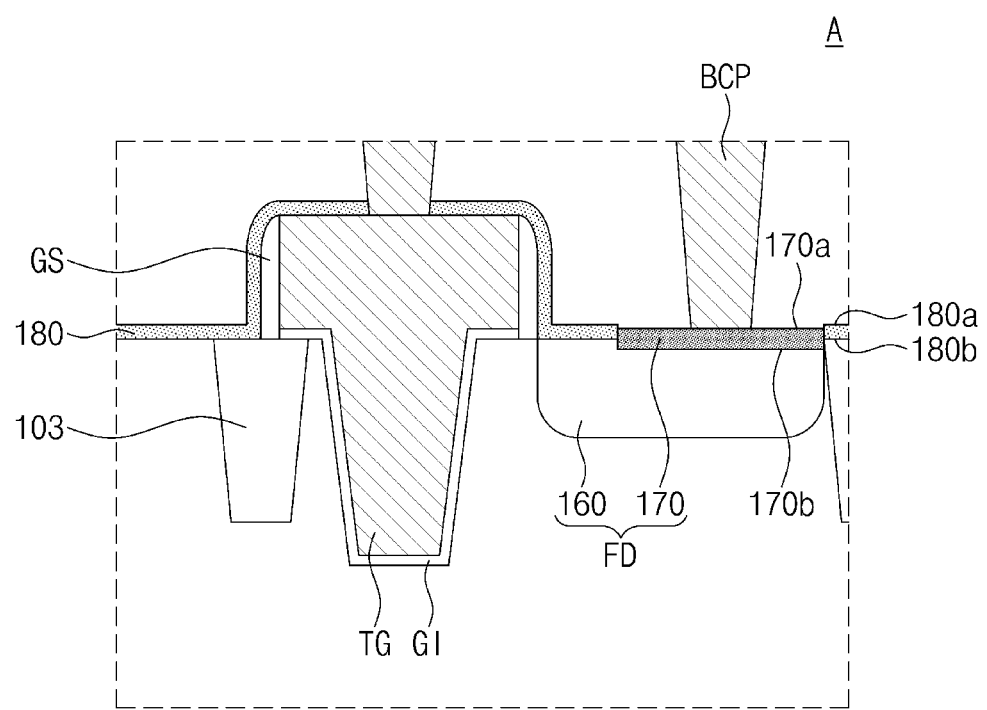
FIG. 5 illustrates an enlarged view of an image sensor taken from section A of FIG. 4 according to an embodiment of the present inventive concept.

FIG. 3 illustrates a plan view showing an image sensor according to an embodiment of the present inventive concept. FIG. 4 illustrates a cross-sectional view taken along line I-I' of FIG. 3, showing an image sensor according to an embodiment of the present inventive concept. FIG. 5 illustrates an enlarged view showing section A of FIG. 4.

Referring to FIGS. 3, 4A, and 4B, an image sensor according to an embodiment of the present inventive concept may include a photoelectric conversion layer 10, a wiring layer 20, and an optical transmission layer 30. The photoelectric conversion layer 10 may be disposed between the wiring layer 20 and the optical transmission layer 30 (e.g., in the third direction D3).

The photoelectric conversion layer 10 may include a substrate 100. The substrate 100 may be a semiconductor substrate (e.g., a silicon substrate, a germanium substrate, a silicon-germanium substrate, a II-VI group compound semiconductor substrate, or a III-V group compound semiconductor substrate) or a silicon-on-insulator (SOI) substrate. However, embodiments of the present inventive concept are not necessarily limited thereto. The substrate 100 may have a first surface 100a and a second surface 100b that are opposite to each other (e.g., in the third direction D3). For example, the first surface 100a of the substrate 100 may be a front surface, and the second surface 100b of the substrate 100 may be a rear surface. The substrate 100 may receive light incident on the second surface 100b.

The substrate 100 may include a plurality of pixel sections PX. When viewed in plan, the plurality of pixel sections PX may be two-dimensionally arranged along first and second directions D1 and D2 that are parallel to the second surface 100b of the substrate 100. The first direction D1 and the second direction D2 may intersect each other. The substrate 100 may include a plurality of photoelectric conversion regions PD therein. The photoelectric conversion regions PD may be positioned between the first surface 100a and the second surface 100b of the substrate 100 (e.g., in the third direction D3). In an embodiment, the third direction D3 may be perpendicular to the first and second directions D1, D2. The photoelectric conversion regions PD may be correspondingly provided in the pixel sections PX of the substrate 100. In this description, the photoelectric conversion region PD may indicate an area that the photoelectric conversion element PD of FIGS. 1 and 2 are disposed thereon.

In an embodiment, the substrate 100 may have a first conductivity type, and the photoelectric conversion region PD may have a second conductivity type different from the first conductivity type. For example, the first conductivity type may be p-type, and the second conductivity type may be n-type. The impurities of a region having the first conductivity may include, for example, at least one compound selected from aluminum, boron, indium, and gallium. However, embodiments of the present inventive concept are not necessarily limited thereto. The impurities of a region having the second conductivity type may include, for example, at least one compound selected from phosphorus, arsenic, bismuth, and antimony. However, embodiments of the present inventive concept are not necessarily limited thereto. The photoelectric conversion region PD and the substrate 100 may form a p-n junction to constitute a photodiode.

The photoelectric conversion layer 10 may include a shallow isolation pattern 103. The shallow isolation pattern 103 may be disposed adjacent to the first surface 100a of the substrate 100. The plurality of pixel sections PX may include corresponding active regions ACT that are defined by the shallow isolation patterns 103. The shallow isolation patterns 103 may be disposed in a first trench TR1 and a second trench TR2 that are recessed from the first surface 100a of the substrate 100. In an embodiment, the shallow isolation pattern 103 may include at least one compound selected from silicon oxide, silicon nitride, and silicon oxynitride. However, embodiments of the present inventive concept are not necessarily limited thereto.

The photoelectric conversion layer 10 may include a deep isolation pattern 150. The deep isolation pattern 150 may be disposed in the substrate 100 and may be positioned between the plurality of pixel sections PX. The deep isolation pattern 150 may penetrate at least a portion of the substrate 100. The deep isolation pattern 150 may penetrate the shallow isolation pattern 103 to extend into the substrate 100. The deep isolation pattern 150 may be disposed in a third trench TR3. The third trench TR3 may penetrate the shallow isolation pattern 103 to extend toward the second surface 100b of the substrate 100. In an embodiment, a width at an upper portion of the third trench TR3 may be less than a width of a bottom surface of the first trench TR1. In this description, the term "width" may mean a distance measured in a direction (e.g., the second direction D2) parallel to the second surface 100b of the substrate 100. When viewed in plan, the deep isolation pattern 150 may have a lattice structure that surrounds each of the plurality of pixel sections PX. According to an embodiment, the deep isolation pattern 150 may extend from the first surface 100a of the substrate 100 toward the second surface 100b of the substrate 100, and may have a bottom surface 150b substantially coplanar with the second surface 100b of the substrate 100. For example, the deep isolation pattern 150 may include a dielectric material having a refractive index that is less than that of the substrate 100.

The deep isolation pattern 150 may include a separation pattern 151, a semiconductor pattern 153, and a dielectric pattern 155. The separation pattern 151 may penetrate at least a portion of the substrate 100. The separation pattern 151 may be interposed between the pixel section PX and the semiconductor pattern 153. The separation pattern 151 may be interposed between the substrate 100 and a lateral surface of the semiconductor pattern 153 and between the shallow isolation pattern 103 and the dielectric pattern 155. The separation pattern 151 may extend from the lateral surface of the semiconductor pattern 153 toward a lateral surface of the dielectric pattern 155. The separation pattern 151 may fill at least a portion of the third trench TR3. For example, in an embodiment, the separation pattern 151 may cover an inner sidewall of the third trench TR3. In an embodiment, the separation pattern 151 may expose a bottom surface of the third trench TR3. When viewed in plan, the separation pattern 151 may surround each of the pixel sections PX. In an embodiment, the separation pattern 151 may include, for example, at least one compound selected from oxide, nitride, metal oxide, and metal nitride. The separation pattern 151 may include, for example, at least one compound selected from silicon oxide, silicon nitride, and silicon oxynitride. However, embodiments of the present inventive concept are not necessarily limited thereto.

The semiconductor pattern 153 may penetrate at least a portion of the substrate 100 (e.g., in the first and/or second directions D1, D2). The semiconductor pattern 153 may be interposed between the plurality of pixel sections PX. The semiconductor pattern 153 may fill a lower portion of the third trench TR3. The semiconductor pattern 153 may cover the bottom surface of the third trench TR3. The semiconductor pattern 153 may cover an inner sidewall of the separation pattern 151 and may directly contact the separation pattern 151. The semiconductor pattern 153 may have a top surface located at a lower level than a level of the first surface 100a of the substrate 100. In this description, the term "level" may indicate a height (e.g., length in the third direction D3) from the second surface 100b of the substrate 100. The semiconductor pattern 153 may have a bottom surface that corresponds to that of the deep isolation pattern 150, and may be substantially coplanar with the second surface 100b of the substrate 100. In an embodiment, the semiconductor pattern 153 may include a conductive material, for example, a semiconductor material doped with impurities. For example, the semiconductor pattern 153 may include doped polysilicon.

The dielectric pattern 155 may be disposed on the semiconductor pattern 153. The dielectric pattern 155 may be disposed in the shallow isolation pattern 103 in the first trench TR1. The dielectric pattern 155 may penetrate the shallow isolation pattern 103 in the first trench TR1 and may directly contact the semiconductor pattern 153. The separation pattern 151 may separate the dielectric pattern 155 from the shallow isolation pattern 103 in the first trench TR1. In an embodiment, the dielectric pattern 155 may include, for example, at least one compound selected from silicon oxide, silicon nitride, and silicon oxynitride. However, embodiments of the present inventive concept are not necessarily limited thereto.

The first surface 100a of the substrate 100 may include the transfer transistors TX and the logic transistors RX, SX, and DX that are discussed above with reference to FIG. 1. The transistors, such as the transfer transistor TX, the reset transistor RX, the drive transistor DX, and the selection transistor SX, may be correspondingly disposed on the active regions ACT of the pixel sections PX. The transfer transistor TX may include a gate electrode TG and a floating diffusion region FD that are provided on the active region ACT. The gate electrode TG may correspond to the transfer gate TRG discussed above with reference to FIG. 2. The gate electrode TG may be disposed on a corresponding photoelectric conversion region PD. The gate electrode TG may be disposed adjacent to the shallow isolation pattern 103 in the second trench TR2. For example, the gate electrode TG may be disposed on the shallow isolation pattern 103. A lower portion of the gate electrode TG may be inserted into the substrate 100. For example, the lower portion of the gate electrode TG being inserted into the substrate 100 means that the lower portion of the gate electrode TG is spaced apart from the first surface 100a of the substrate (e.g., in the third direction D3) towards the second surface 100b of the substrate. An upper portion of the gate electrode TG may protrude beyond the first surface 100a of the substrate 100. For example, the upper portion of the gate electrode TG protruding beyond the first surface 100a means that the upper portion of the gate electrode TG extends above the first surface 100a of the substrate 100 towards the wiring layer 20 (e.g., in the third direction D3). The gate electrode TG may have a bottom surface disposed in the substrate 100. A gate dielectric layer GI may be interposed between the gate electrode TG and the substrate 100. In an embodiment, the gate dielectric layer GI may include silicon oxide or a high-k dielectric material having a dielectric constant that is greater than that of silicon oxide. A gate spacer GS may be provided on an upper sidewall of the gate electrode TG. For example, the gate spacer GS may be disposed on a sidewall of an upper portion of the gate electrode TG that protrudes beyond the first surface 100a of the substrate 100. In an embodiment, the gate spacer GS may include at least one compound selected from silicon oxide, silicon nitride, and silicon oxynitride. However, embodiments of the present inventive concept are not necessarily limited thereto.

The floating diffusion region FD may be disposed on one side of the gate electrode TG (e.g., in the first and/or second directions D1, D2) and may be located in a corresponding active region ACT. The floating diffusion region FD may be disposed on a corresponding photoelectric conversion region PD. The floating diffusion region FD may have the second conductivity type (e.g., n-type) different from the first conductivity type of the substrate 100.

Each of the floating diffusion regions FD may include an impurity region 160 and a doping pad 170. The impurity region 160 may be disposed adjacent to the first surface 100a of the substrate 100. The impurity region 160 may be disposed adjacent to the doping pad 170. The impurity region 160 may surround a lower portion of the doping pad 170. The impurity region 160 may have the second conductivity type (e.g., n-type). The impurity region 160 may be an area doped with impurities such as, for example, at least one compound selected from phosphorus (P) and arsenic (As). However, embodiments of the present inventive concept are not necessarily limited thereto. For example, the impurity region 160 may be an area doped with low-concentration impurities.

The doping pad 170 may be provided in a corresponding pixel section PX and on a corresponding photoelectric conversion region PD. The doping pad 170 may be disposed adjacent to the first surface 100a of the substrate 100. The doping pad 170 may be horizontally spaced apart (e.g., in the first and/or second directions D1, D2) and vertically spaced apart (e.g., in the third direction D3) from the lower portion of the gate electrode TG that is inserted into the substrate 100. The doping pad 170 may be horizontally spaced apart (e.g., in the first and/or second directions D1, D2) from the deep isolation pattern 150 and may not vertically overlap the deep isolation pattern 150. The doping pad 170 may be exposed on the first surface 100a of the substrate 100. In an embodiment, the doping pad 170 may have a top surface 170a located at a higher level than the level of a top surface of the impurity region 160. In an embodiment, the doping pad 170 may include, for example, at least one compound selected from doped epitaxial silicon and doped polysilicon. The doping pad 170 may have the second conductivity type (e.g., n-type). In some embodiments, when the doping pad 170 includes epitaxial silicon doped with n-type impurities, the photoelectric conversion layer 10 may not include a dummy pattern 175 which will be discussed with reference to FIGS. 7 to 9. The impurities doped in the doping pad 170 may include, for example, at least one compound selected from phosphorus (P) and arsenic (As). The doping pad 170 may be doped with high-concentration impurities. For example, a concentration of impurities in the doping pad 170 may be greater than a concentration of impurities in the impurity region 160.

In some embodiments, the top surface 170a of the doping pad 170 may be located at a higher level than the level of the first surface 100a of the substrate 100. The doping pad 170 may have a bottom surface 170b located at a lower level than that of the first surface 100a of the substrate 100. The doping pad 170 may have a sidewall having a portion that directly contacts the shallow isolation pattern 103 adjacent thereto. The top surface 170a of the doping pad 170 may be located at a lower level than that of a top surface 180a of an etch stop layer 180 (or on the impurity region 160) which will be discussed below. The bottom surface 170b of the doping pad 170 may be located at a lower level than the level of a bottom surface 180b of the etch stop layer 180. However, embodiments of the present inventive concept are not necessarily limited thereto. In some embodiments, the top surface 170a of the doping pad 170 may be substantially coplanar with the top surface 180a of the etch stop layer 180 on the impurity region 160, and the bottom surface 170b of the doping pad 170 may be substantially coplanar with the bottom surface 180b of the etch stop layer 180.

According to an embodiment of the present inventive concept, the floating diffusion region FD may include the doping pad 170 doped with high-concentration impurities, and the doping pad 170 may be horizontally and vertically spaced apart from the lower portion of the gate electrode TG that is inserted into the substrate 100. An increase in horizontal and vertical distances between the gate electrode TG and the doping pad 170 may prevent gate induced drain leakage (GIDL) phenomena that occur between the gate electrode TG and the doping pad 170 (or the floating diffusion region FD).

The etch stop layer 180 may be disposed on the first surface 100a of the substrate 100. The etch stop layer 180 may be interposed between the first surface 100a of the substrate 100 and a first interlayer dielectric layer 210 (e.g., in the third direction D3) which will be discussed below. The etch stop layer 180 may cover the first surface 100a of the substrate 100. The etch stop layer 180 may cover the transistors, such as the transfer transistor TX, the reset transistor RX, the drive transistor DX, and the selection transistor SX. The etch stop layer 180 may cover the gate electrode TG and the gate spacer GS. The etch stop layer 180 may not cover but may expose the doping pad 170. In an embodiment, the etch stop layer 180 may include at least one compound selected from silicon oxide, silicon nitride, silicon oxynitride, and silicon carbonitride. However, embodiments of the present inventive concept are not necessarily limited thereto.

The drive transistor DX may include a drive gate SFG on a corresponding active region ACT, and the selection transistor SX may include a selection gate SG on a corresponding active region ACT. The reset transistor RX may include a reset gate RG on a corresponding active region ACT. An additional gate dielectric layer GI may be interposed between the substrate 100 and each of the drive, selection, and reset gates SFG, SG, and RG.

The wiring layer 20 may be disposed on the first surface 100a of the substrate 100. In an embodiment, the wiring layer 20 may include a first interlayer dielectric layer 210, a second interlayer dielectric layer 220, and a third interlayer dielectric layer 230 that are sequentially stacked on the first surface 100a of the substrate 100 (e.g., in the third direction D3). The wiring layer 20 may further include contact plugs BCP in the first interlayer dielectric layer 210, first wiring patterns 222 in the second interlayer dielectric layer 220, and second wiring patterns 232 in the third interlayer dielectric layer 230. The first interlayer dielectric layer 210 may be disposed on the first surface 100a of the substrate 100 and may cover the transistors, such as the transfer transistor TX, the reset transistor RX, the drive transistor DX, and the selection transistor SX, and some of the contact plugs BCP may be connected to terminals of the transistors. Some of the contact plugs BCP may be coupled to the floating diffusion region FD and may directly contact the doping pad 170. The contact plugs BCP may be connected to corresponding ones of the first wiring patterns 222, and the first wiring patterns 222 may be connected to corresponding ones of the second wiring patterns 232. The first and second wiring patterns 222 and 232 may be electrically connected through the contact plugs BCP to the transistors. In an embodiment, each of the first, second, and third interlayer dielectric layers 210, 220, and 230 may include a dielectric material, and the contact plugs BCP, the first wiring patterns 222, and the second wiring patterns 232 may include a conductive material.

In some embodiments, the pixel section PX may be a shared pixel. For example, a plurality of photoelectric conversion regions PD may share one floating diffusion region FD. For example, the floating diffusion region FD may be shared through the doping pad 170 and the contact plugs BCP.

The optical transmission layer 30 may be disposed on the second surface 100b of the substrate 100. The optical transmission layer 30 may include a plurality of color filters CF and a plurality of microlenses 330. The optical transmission layer 30 may focus and filter externally incident light, and the photoelectric conversion layer 10 may be provided with the focused and filtered light.

The microlenses 330 may be provided on the second surface 100b of the substrate 100. In an embodiment, each of the microlenses 330 may be disposed to vertically (e.g., in the third direction D3) overlap the photoelectric conversion region PD of the pixel section PX that corresponds thereto. Each of the microlenses 330 may have a convex shape to condense light that is incident on the pixel section PX.

The color filters CF may be disposed between the microlenses 330 and the second surface 100b of the substrate 100. Each of the color filters CF may be disposed to vertically (e.g., in the third direction D3) overlap the photoelectric conversion region PD on the pixel section PX that corresponds thereto. In an embodiment, the color filters CF may include red, green, and blue filters depending on a unit pixel. The color filters CF may be arranged two-dimensionally, and may include a yellow filter, a magenta filter, and a cyan filter. However, embodiments of the present inventive concept are not necessarily limited thereto and the colors of the color filters CF may vary.

An antireflection layer 310 may be disposed on the second surface 100b of the substrate 100 (e.g., disposed directly thereon in the third direction D3). The antireflection layer 310 may be interposed between the color filters CF and the second surface 100b of the substrate 100 (e.g., in the third direction D3). The antireflection layer 310 may conformally cover the second surface 100b of the substrate 100. The antireflection layer 310 may prevent light reflection such that the photoelectric conversion region PD may be allowed to readily receive light incident on the second surface 100b of the substrate 100. In an embodiment, the antireflection layer 310 may include, for example, at least one compound selected from silicon oxide, silicon nitride, silicon oxynitride, and high-k dielectric materials (e.g., hafnium oxide or aluminum oxide). However, embodiments of the present inventive concept are not necessarily limited thereto.

A first passivation layer 312 may be interposed between the antireflection layer 310 and the color filters CF (e.g., in the third direction D3). A second passivation layer 322 may be interposed between the color filters CF and the microlenses 330 (e.g., in the third direction D3). The first passivation layer 312 may conformally cover the antireflection layer 310. In an embodiment, the first passivation layer 312 may include, for example, at least one compound selected from metal oxide and nitride. For example, the metal oxide may include aluminum oxide, and the nitride may include silicon nitride. However, embodiments of the present inventive concept are not necessarily limited thereto.

A grid pattern 315 may be provided between the pixel sections PX. The grid pattern 315 may be interposed between the first passivation layer 312 and the color filters CF (e.g., in the first and/or second directions D1, D2). The grid pattern 315 may be disposed to vertically overlap the deep isolation pattern 150. In an embodiment, when viewed in plan, the grid pattern 315 may have a lattice shape. When the substrate 100 receives light on the second surface 100b thereof, the grid pattern 315 may guide the light to enter the photoelectric conversion region PD. In an embodiment, the grid pattern 315 may include at least one compound selected from a metallic material or a low-refractive-index (LRI) material. The metallic material may include, for example, at least one compound selected from tungsten and titanium. The low-refractive-index (LRI) material may include, for example, at least one compound selected from silicon oxide and a material having a refractive index that is less than that of the color filters CF. However, embodiments of the present inventive concept are not necessarily limited thereto.

Figure 6:
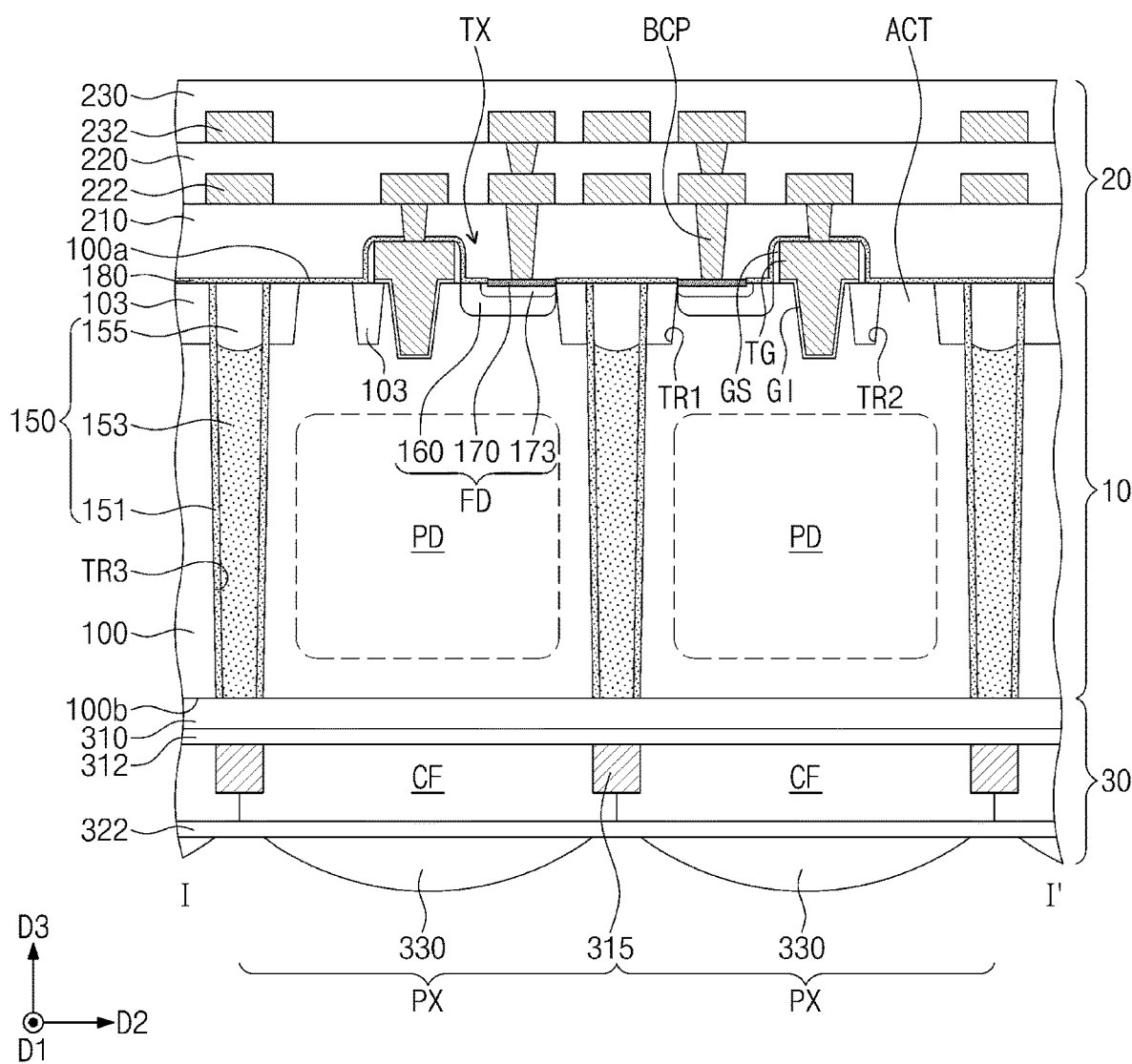
FIG. 6 illustrates a cross-sectional view of an image sensor taken along line I-I' of FIG. 3 according to an embodiment of the present inventive concept.

FIG. 6 illustrates a cross-sectional view taken along line I-I' of FIG. 3, showing an image sensor according to an embodiment of the present inventive concept. For brevity of description, the following discussion will focus on differences from the image sensor discussed with reference to FIGS. 1 to 5 and a repeated description of identical or similar elements may be omitted.

Referring to FIGS. 3 and 6, an image sensor according to embodiments of the present inventive concept may include the photoelectric conversion layer 10, the wiring layer 20, and the optical transmission layer 30.

The floating diffusion region FD may further include an additional impurity region 173. The additional impurity region 173 may be interposed between the impurity region 160 and the doping pad 170. The additional impurity region 173 may be disposed adjacent to the first surface 100a of the substrate 100. The additional impurity region 173 may be disposed adjacent to the doping pad 170 (e.g., immediately adjacent). The additional impurity region 173 may surround a lower portion of the doping pad 170. The additional impurity region 173 may include impurities that are different from the impurities of the doping pad 170. In an embodiment, the additional impurity region 173 may be, for example, an area doped with impurities including at least one compound selected from carbon (C) and germanium (Ge). However, embodiments of the present inventive concept are not necessarily limited thereto. The additional impurity region 173 may prevent impurities in the doping pad 170 from being diffused or introduced into the substrate 100. The additional impurity region 173 may prevent metal elements in the contact plug BCP from being diffused or introduced into the substrate 100.

Figure 7:
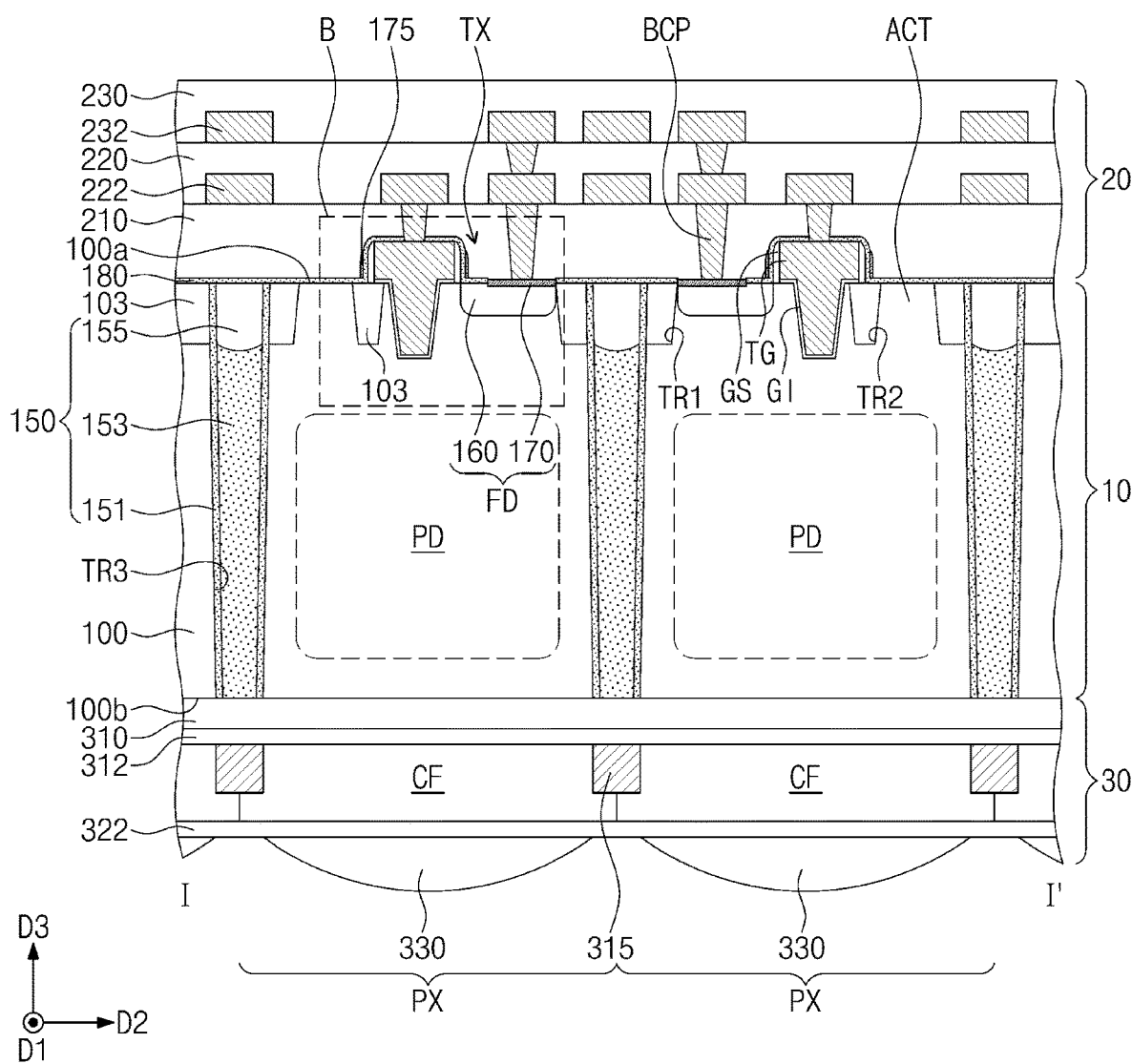
FIG. 7 illustrates a cross-sectional view of an image sensor taken along line I-I' of FIG. 3 according to an embodiment of the present inventive concept.
Figure 8:
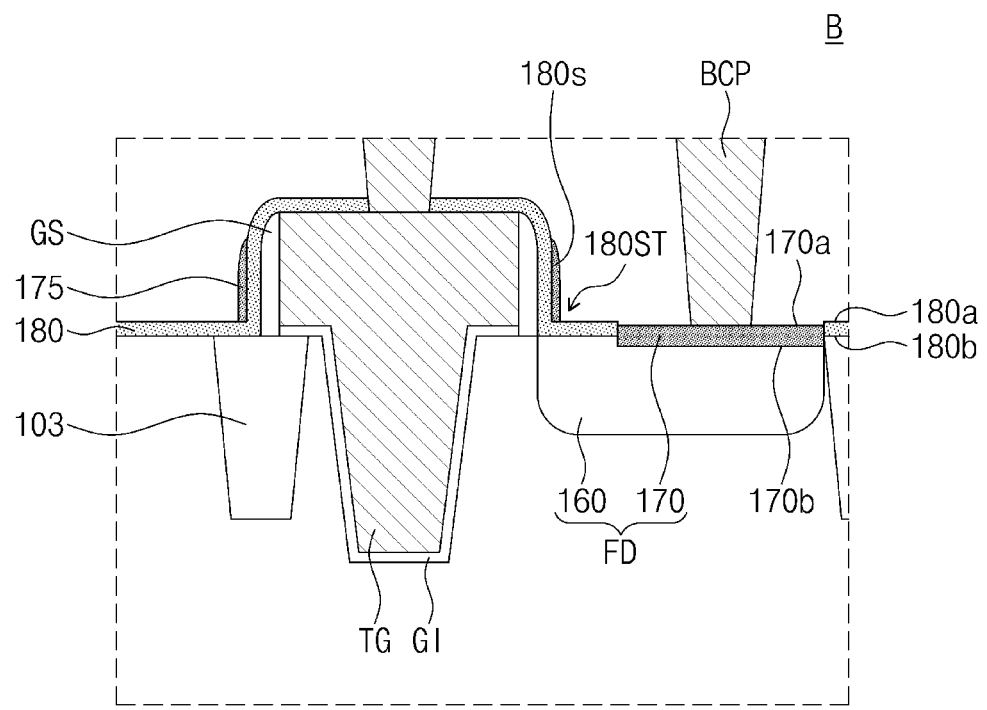
FIG. 8 illustrates an enlarged view of an image sensor taken from section B of FIG. 7 according to an embodiment of the present inventive concept.

FIG. 7 illustrates a cross-sectional view taken along line I-I' of FIG. 3, showing an image sensor according to an embodiment of the present inventive concept. FIG. 8 illustrates an enlarged view showing section B of FIG. 7. For brevity of description, the following discussion will focus on differences from the image sensor discussed with reference to FIGS. 1 to 5 and a repeated description of identical or similar elements may be omitted.

Referring to FIGS. 3, 7, and 8, an image sensor according to an embodiment of the present inventive concept may include the photoelectric conversion layer 10, the wiring layer 20, and the optical transmission layer 30.

The photoelectric conversion layer 10 may further include a dummy pattern 175. The dummy pattern 175 may be provided on the first surface 100a of the substrate 100. The dummy pattern 175 may be disposed on the etch stop layer 180 (e.g., disposed directly thereon). The dummy pattern 175 may be interposed between the etch stop layer 180 and the first interlayer dielectric layer 210. The dummy pattern 175 may be disposed on a sidewall of the gate electrode TG and on a stepped part 180ST of the etch stop layer 180 positioned between the gate electrode TG and the impurity region 160. The dummy pattern 175 may cover a portion of a sidewall 180s of the stepped part 180ST. The dummy pattern 175 may cover a portion the etch stop layer 180 on the gate spacer GS. A location where the dummy pattern 175 is disposed is not limited to that show in the figures, and may be variously changed. In an embodiment, the dummy pattern 175 may include the same material as that of the doping pad 170. The dummy pattern 175 may include, for example, at least one compound selected from epitaxial silicon and polysilicon. For example, the doping pad 170 and the dummy pattern may have the second conductivity type (e.g., n-type).

Figure 9:
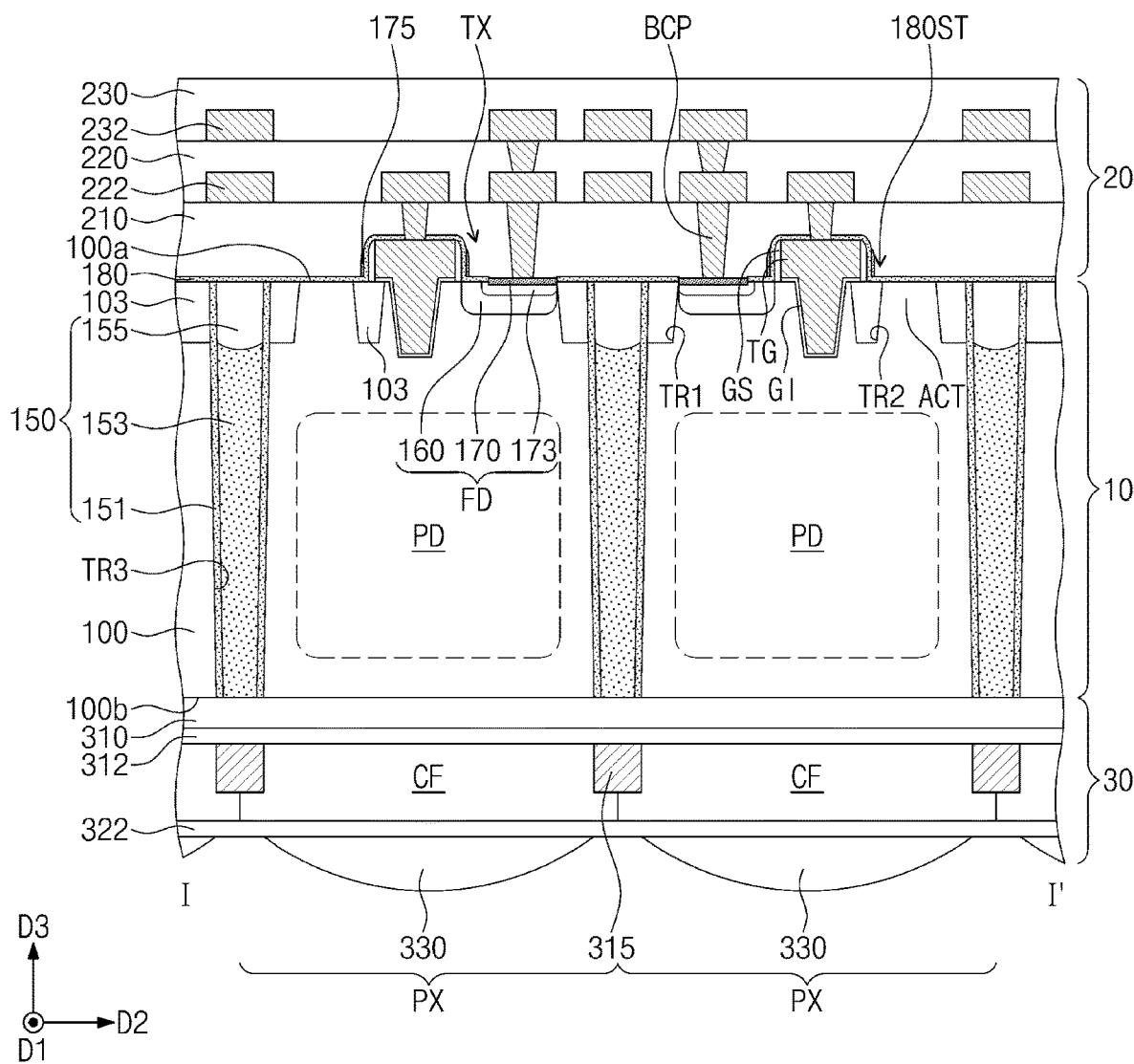
FIG. 9 illustrates a cross-sectional view of an image sensor taken along line I-I' of FIG. 3 according to an embodiment of the present inventive concept.

FIG. 9 illustrates a cross-sectional view taken along line I-I' of FIG. 3, showing an image sensor according to an embodiment of the present inventive concept. A repetitive discussion will be omitted in the interest of brevity of description.

Referring to FIGS. 3 and 9, an image sensor according to the present inventive concept may include the photoelectric conversion layer 10, the wiring layer 20, and the optical transmission layer 30. The floating diffusion region FD may further include an additional impurity region 173 between the impurity region 160 and the doping pad 170. The additional impurity region 173 may be, for example, an area doped with impurities including at least one compound selected from carbon (C) and germanium (Ge). However, embodiments of the present inventive concept are not necessarily limited thereto.

The photoelectric conversion layer 10 may be provided between the etch stop layer 180 and the first interlayer dielectric layer 210, and may further include a dummy pattern 175 disposed on a stepped part 180ST of the etch stop layer 180 formed on the gate spacer GS. The dummy pattern 175 may be disposed on a sidewall of the gate electrode TG. In an embodiment, the dummy pattern 175 may include the same material as that of the doping pad 170. For example, the doping pad 170 may include polysilicon doped with n-type impurities, and the dummy pattern 175 may include polysilicon doped with n-type impurities. However, embodiments of the present inventive concept are not necessarily limited thereto.

FIGS. 10 to 16 illustrate cross-sectional views taken along line I-I' of FIG. 3, showing a method of fabricating an image sensor according to some embodiments of the present inventive concept. For brevity of description, omission will be made to avoid repetitive explanations about the image sensor discussed with reference to FIGS. 1 to 5.

Figure 10:
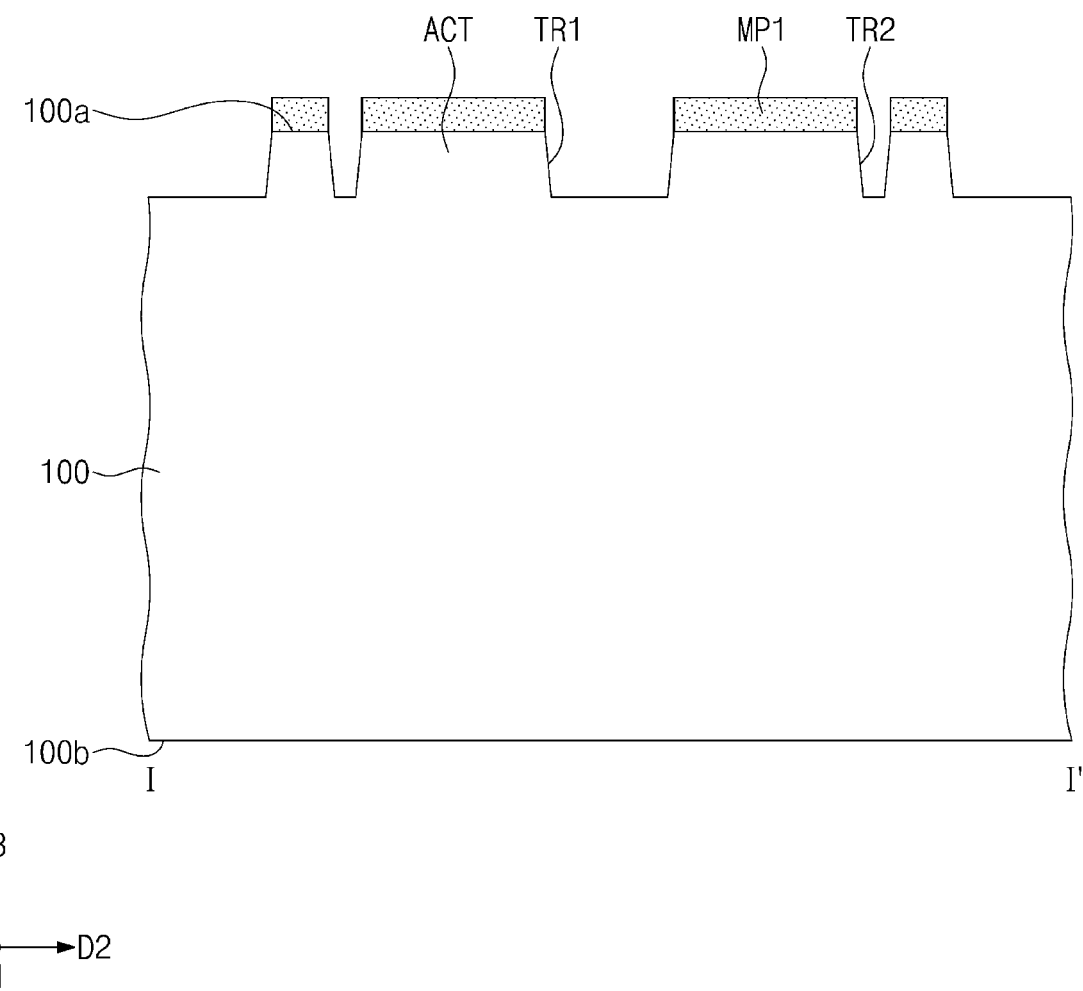
FIGS. 10 to 16 illustrate cross-sectional views taken along line I-I' of FIG. 3, showing a method of fabricating an image sensor according to some embodiments of the present inventive concept.

Referring to FIGS. 3 and 10, a substrate 100 may be provided which has a first surface 100a and a second surface 100b that are opposite to each other (e.g., in the third direction D3). A first trench TR1 and a second trench TR2 may be formed adjacent to the first surface 100a of the substrate 100. The first trench TR1 may have a width greater than a width of the second trench TR2. In an embodiment, the formation of the first trench TR1 and the second trench TR2 may include forming a first mask pattern MP1 on the first surface 100a of the substrate 100 and using the first mask pattern MP1 as an etching mask to etch the substrate 100. The first trench TR1 and the second trench TR2 may define active regions ACT in the substrate 100.

Figure 11:
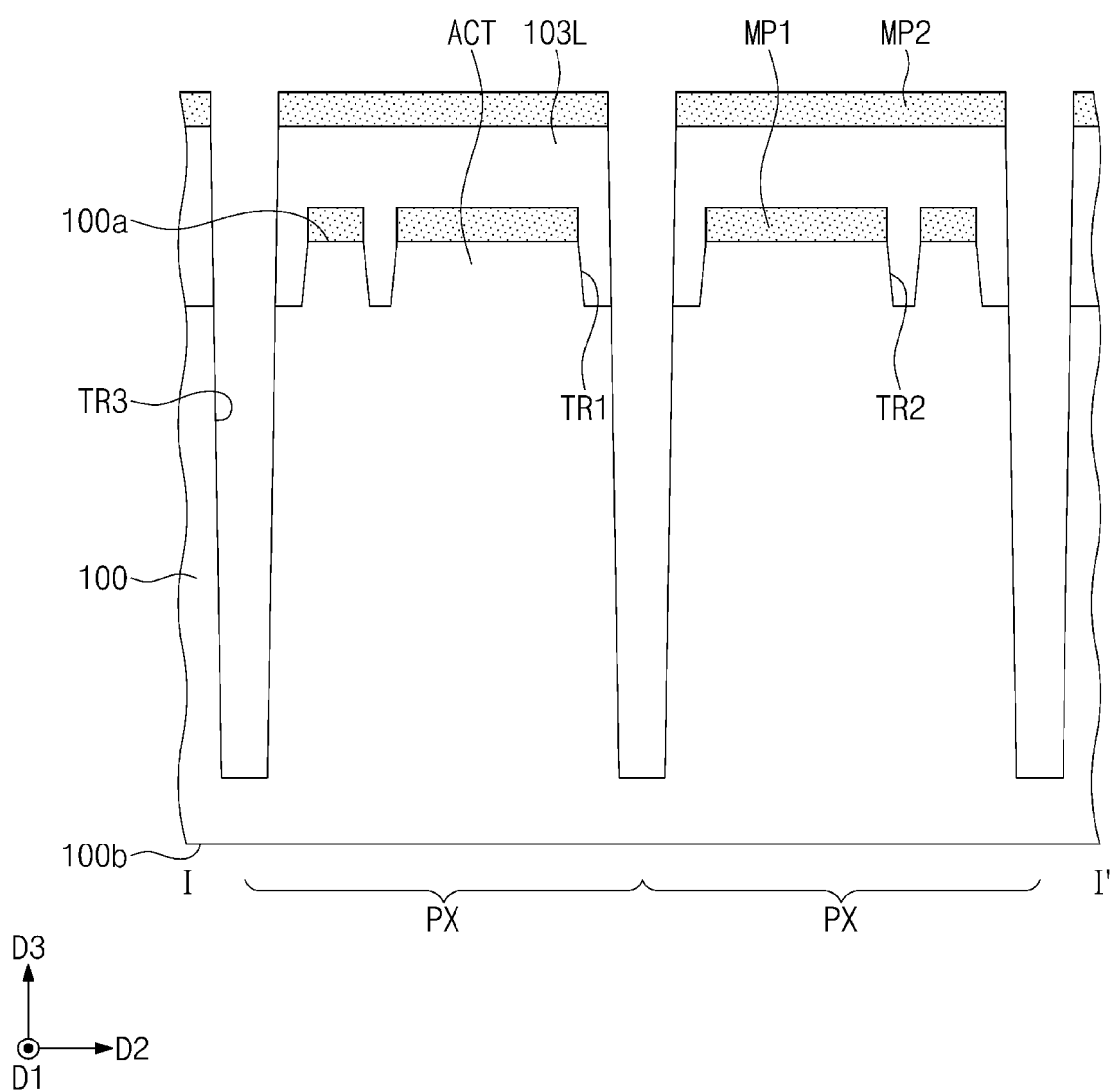

Referring to FIGS. 3 and 11, a device isolation layer 103L may be formed on the first surface 100a of the substrate 100. The device isolation layer 103L may fill the first trench TR1 and the second trench TR2, while covering the first mask pattern MP1. In an embodiment, the device isolation layer 103L may include at least one compound selected from silicon oxide, silicon nitride, and silicon oxynitride. However, embodiments of the present inventive concept are not necessarily limited thereto.

A third trench TR3 may be formed in the substrate 100. The third trench TR3 may have a depth greater than a depth of the first trench TR1 and that of the second trench TR2. The formation of the third trench TR3 may include forming on the device isolation layer 103L a second mask pattern MP2 that defines an area where the third trench TR3 will be formed, and using the second mask pattern MP2 as an etching mask to etch the device isolation layer 103L and the substrate 100. The third trench TR3 may have a bottom surface located at a higher level than a level of the second surface 100b of the substrate 100. The third trench TR3 may define a plurality of pixel sections PX in the substrate 100. The second mask pattern MP2 may then be removed.

Figure 12:
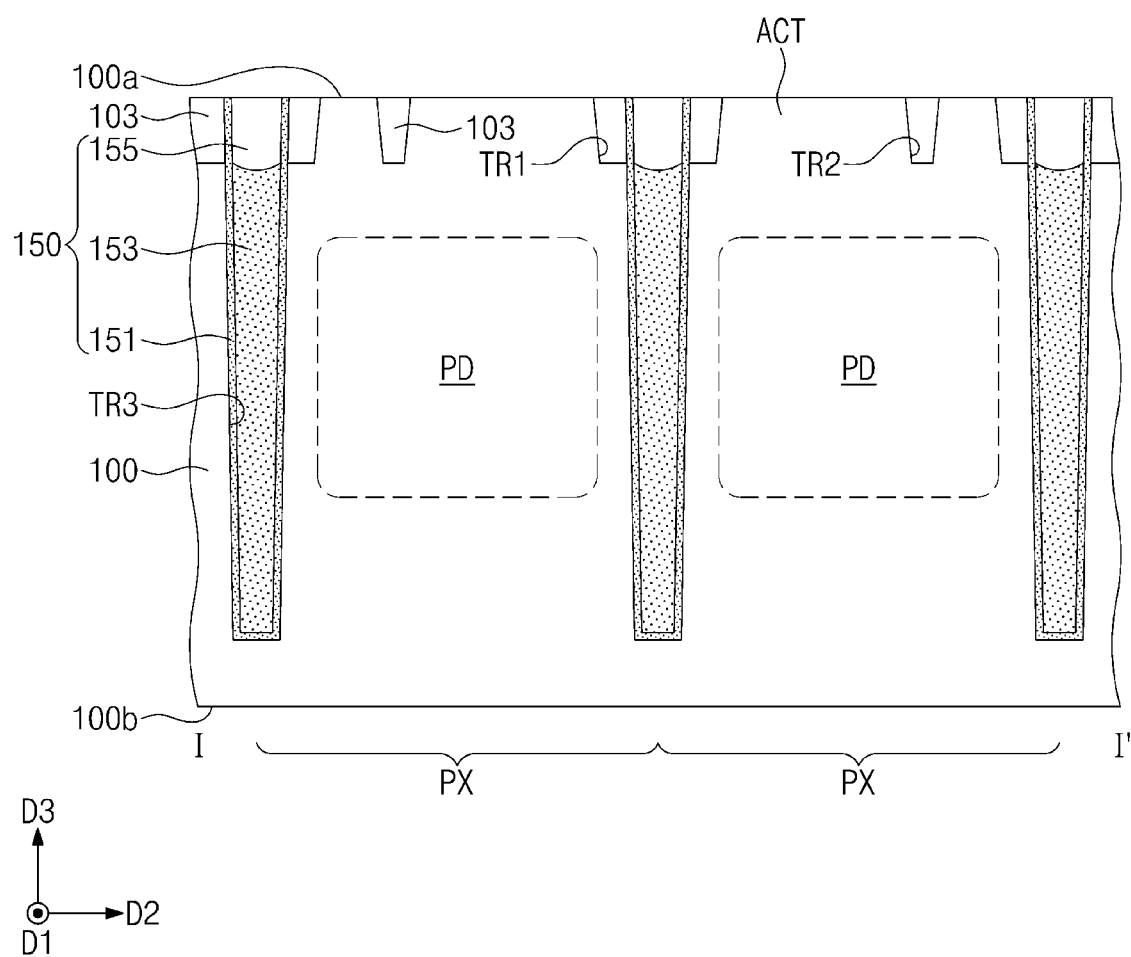

Referring to FIGS. 3 and 12, a separation layer may be formed on the substrate 100. The separation layer may conformally cover an inner sidewall and the bottom surface of the third trench TR3.

A semiconductor pattern 153 may fill a lower portion of the third trench TR3. The formation of the semiconductor pattern 153 may include forming a conductive layer that fills the third trench TR3 and performing an etch-back process on the conductive layer. In an embodiment, the conductive layer may include a conductive material, for example, an impurity-doped semiconductor material. For example, the conductive layer may include doped polysilicon.

A dielectric pattern 155 may be formed to fill an upper portion of the third trench TR3. In an embodiment, the formation of the dielectric pattern 155 may include forming, on the substrate 100 in which the semiconductor pattern 153 is formed, a dielectric layer that fills an occupied portion of the third trench TR3, and allowing the dielectric layer, the separation layer, and the device isolation layer 103L to undergo a planarization process until the first surface 100a of the substrate 100 is exposed. In an embodiment, the dielectric layer may include, for example, at least one compound selected from silicon oxide, silicon nitride, and silicon oxynitride. The planarization process may remove the first mask pattern MP1. The dielectric layer, the separation layer, and the device isolation layer 103L may be planarized to respectively form a dielectric pattern 155, a separation pattern 151, and a shallow isolation pattern 103. Therefore, a deep isolation pattern 150 may be formed which includes the separation pattern 151, the semiconductor pattern 153, and the dielectric pattern 155.

A photoelectric conversion region PD may be formed on each of the plurality of pixel sections PX. The formation of the photoelectric conversion region PD may include, for example, implanting the substrate 100 with impurities. The photoelectric conversion region PD may be a region having a second conductivity type (e.g., n-type) different from a first conductivity type (e.g., p-type).

Figure 13:
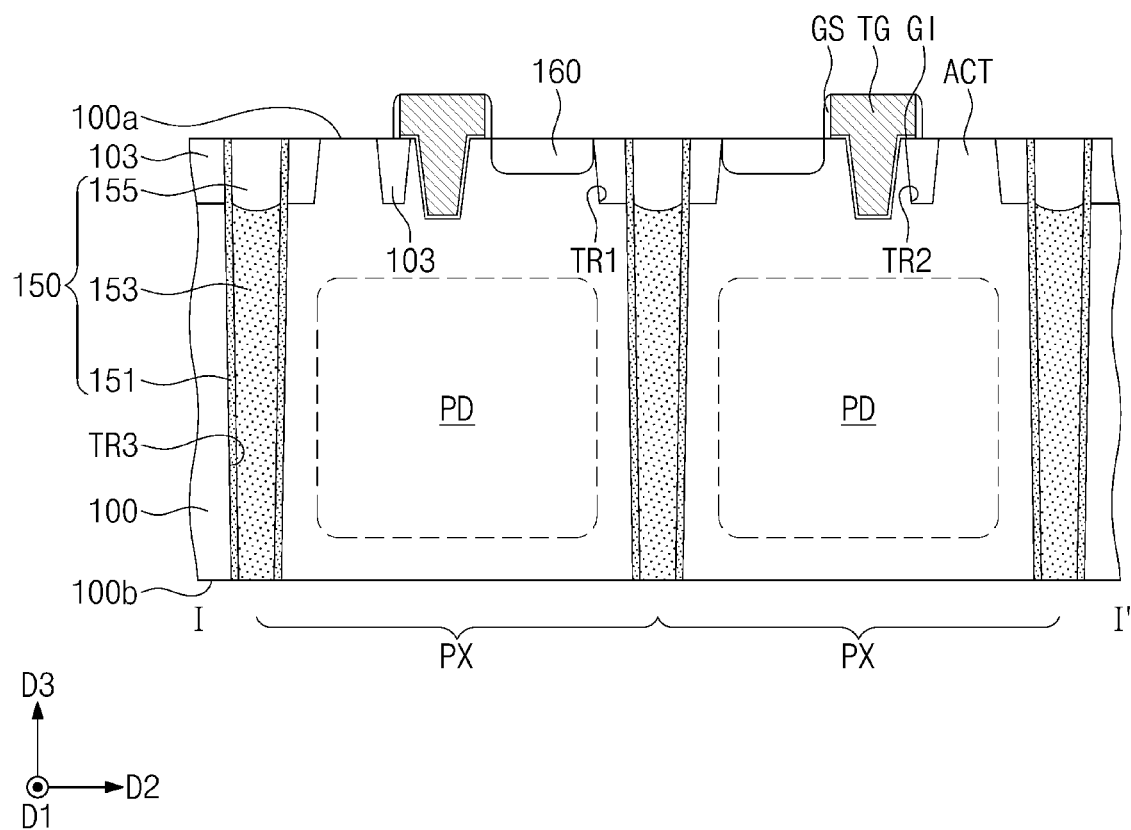

Referring to FIGS. 3 and 13, a thinning process may be performed on the second surface 100b of the substrate 100. The thinning process may partially remove the substrate 100 and the deep isolation pattern 150. The thinning process may remove a lower portion of the deep isolation pattern 150, and a bottom surface of the deep isolation pattern 150 may be substantially coplanar with the second surface 100b of the substrate 100.

A gate electrode TG may be formed on a corresponding active region ACT. The formation of the gate electrode TG may include patterning the substrate 100 to form a vertical trench, forming a conductive layer that fills the vertical trench, and patterning the conductive layer. In an embodiment, prior to the formation of the conductive layer, a gate dielectric layer GI may further be formed to conformally cover the vertical trench.

The first surface 100a of the substrate 100 may undergo a first implantation process to form an impurity region 160. For example, the first implantation process may include forming a mask on the first surface 100a of the substrate 100 and using the mask to dope first impurities into the first surface 100a of the substrate 100. The first impurities may include, for example, at least one compound selected from phosphorus (P) and arsenic (As).

A gate spacer GS may be formed on the gate electrode TG. The gate spacer GS may cover an upper sidewall of the gate electrode TG. In an embodiment, the gate spacer GS may include at least one selected from silicon oxide, silicon nitride, and silicon oxynitride. Therefore, a transfer transistor TX may be formed.

As shown in FIG. 3, transistors such as the transfer transistor TX, the reset transistor RX, the drive transistor DX, and the selection transistor SX, may be formed on the first surface 100a of the substrate 100 and on each pixel section PX. The formation of drive, selection, and reset transistors DX, SX, and RX may include implanting a corresponding active region ACT with impurities to form an impurity region, and forming on the corresponding active region ACT a corresponding one of drive, selection, and rest gates SFG, SG, and RG.

Figure 14:
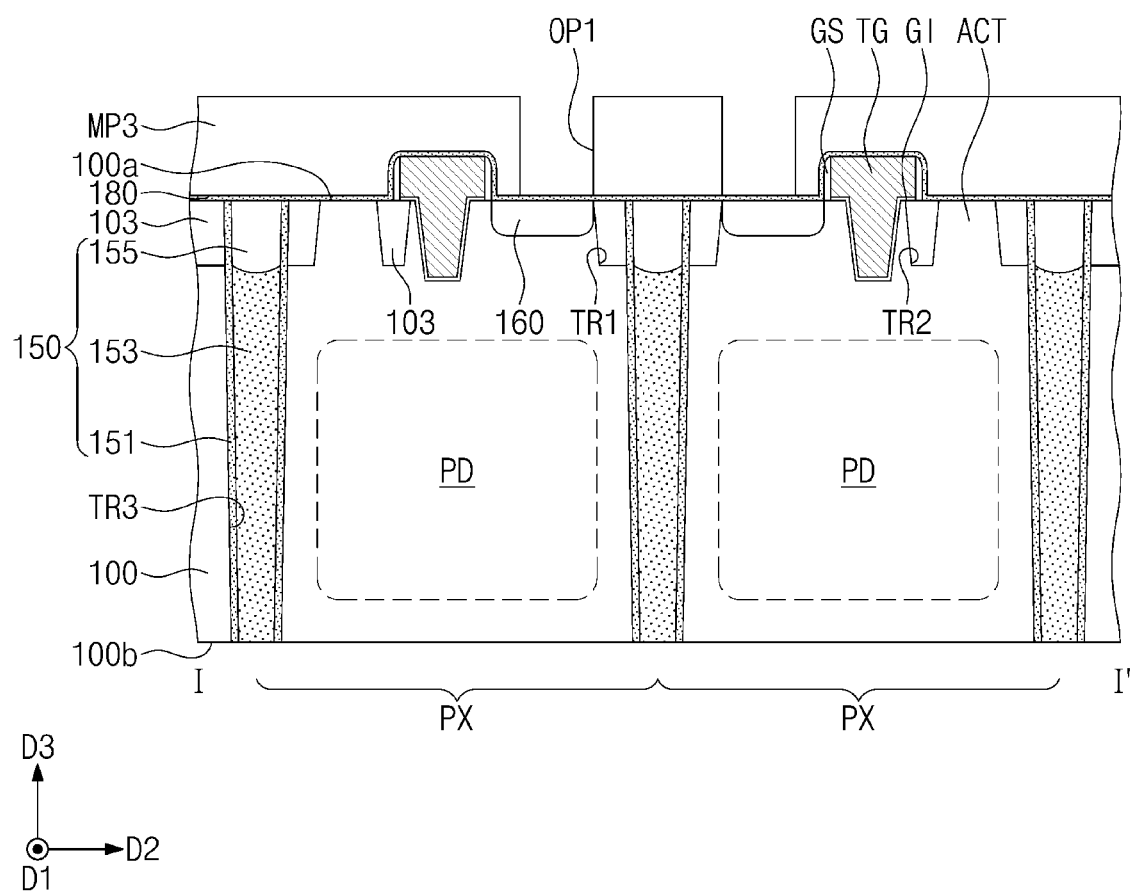

Referring to FIGS. 3 and 14, an etch stop layer 180 may be formed on the first surface 100a of the substrate 100. The etch stop layer 180 may cover the first surface 100a of the substrate 100, the gate electrode TG, and the gate spacer GS. In an embodiment, the etch stop layer 180 may include at least one compound selected from silicon oxide, silicon nitride, silicon oxynitride, and silicon carbonitride.

A third mask pattern MP3 may be formed on the first surface 100a of the substrate 100. The third mask pattern MP3 may include a first opening OP1 that exposes a portion of the etch stop layer 180. The first opening OP1 may define an area on which a doping pad 170 may be formed as discussed below.

Figure 15:
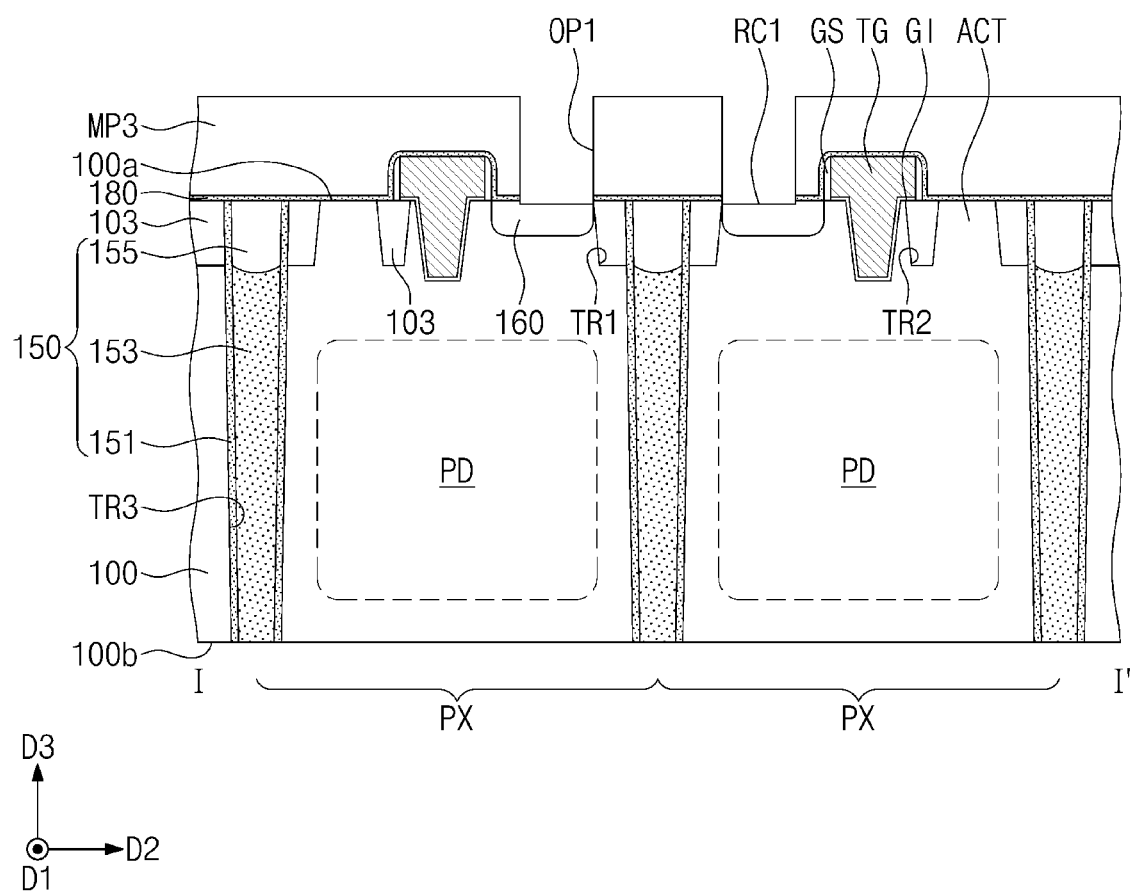

Referring to FIGS. 3 and 15, an etching process may be performed to remove a portion of the etch stop layer 180 that is exposed to the first opening OP1. The etching process may etch a portion of the substrate 100 that is exposed when the portion of the etch stop layer 180 is exposed. Therefore, the substrate 100 may have a recess RC1 that is recessed from the first surface 100a of the substrate 100.

In an embodiment, the first opening OP1 may have a width greater than a width of the recess RC1. However, embodiments of the present inventive concept are not necessarily limited thereto. For example, in an embodiment, the first opening OP1 may have a width substantially the same as the width of the recess RC1.

Figure 16:
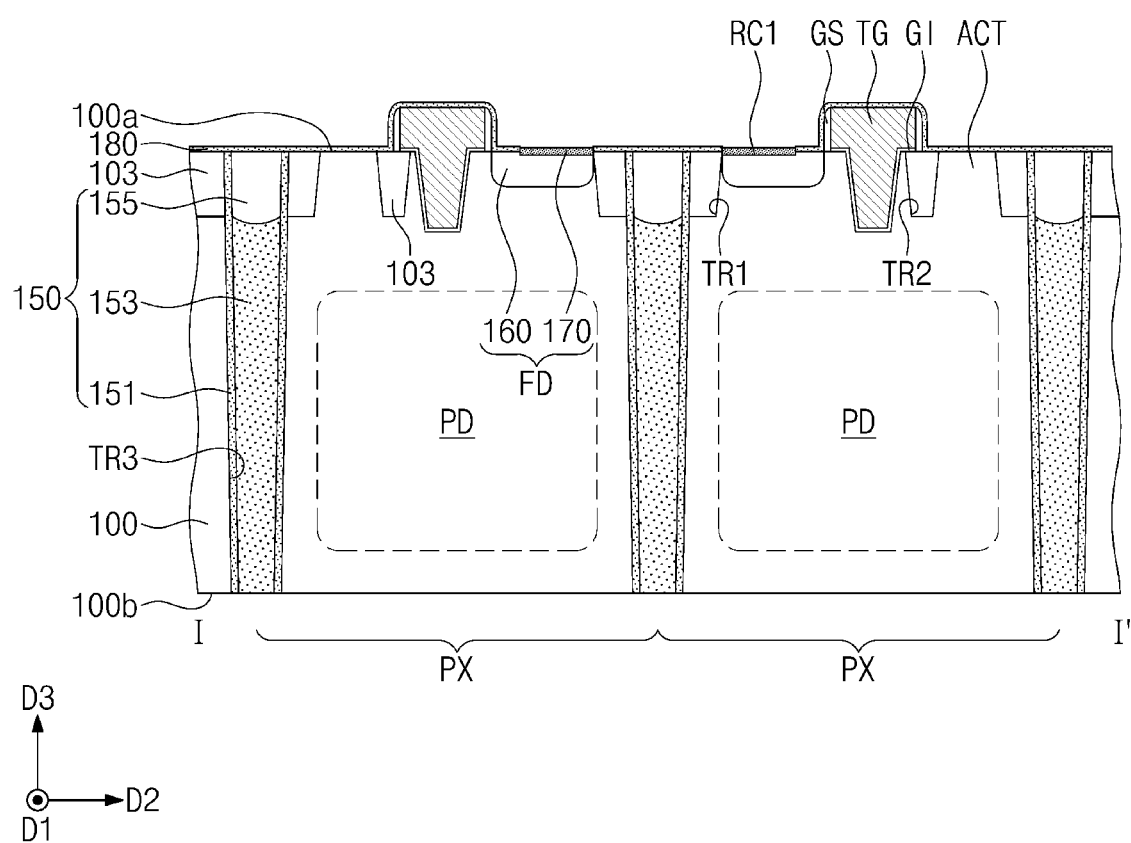

Referring to FIGS. 3 and 16, the third mask pattern MP3 may be removed. A doping pad 170 may be formed on the recess RC1. The formation of the doping pad 170 may include performing an epitaxial growth process to form an epitaxial layer, and performing a second implantation process on the first surface 100a of the substrate 100. The epitaxial layer may be, for example, an epitaxial silicon layer. For example, the second implantation process may include using the third mask pattern MP3 of the substrate 100 to dope second impurities into the first surface 100a of the substrate 100. The second impurities may include, for example, at least one compound selected from phosphorus (P) and arsenic (As). The doping pad 170 may include, for example, epitaxial silicon doped with n-type impurities. A concentration of the second impurities in the doping pad 170 may be greater than a concentration of the first impurities in the impurity region 160. After the formation of the doping pad 170, an annealing process may further be performed. In an embodiment, the annealing process may be, for example, a rapid thermal annealing (RTA) process. The processes mentioned above may form a photoelectric conversion layer 10.

For example, the second implantation process may be performed simultaneously with the formation of the epitaxial layer. However, embodiments of the present inventive concept are not necessarily limited thereto. For example, in an embodiment, after the formation of the epitaxial layer, the second implantation process may be performed. In an embodiment, the epitaxial layer may be formed, and a first interlayer dielectric layer 210 and contact plugs BCP may be formed which will be discussed below, and thereafter the second implantation process may be performed.

Referring back to FIGS. 3, 4, and 5, a wiring layer 20 may be formed on the first surface 100a of the substrate 100. For example, a first interlayer dielectric layer 210 may be formed on the first surface 100a of the substrate 100, and may cover the transistors, such as the transfer transistor TX, the reset transistor RX, the drive transistor DX, and the selection transistor SX. Contact plugs BCP may be formed in the first interlayer dielectric layer 210, and may be connected to terminals of the transistors. Some of the contact plugs BCP may be electrically connected to the doping pad 170. In an embodiment, a second interlayer dielectric layer 220 and a third interlayer dielectric layer 230 may be sequentially formed on the first interlayer dielectric layer 210 (e.g., in the third direction D3). First wiring patterns 222 and second wiring patterns 232 may be formed in the second interlayer dielectric layer 220 and the third interlayer dielectric layer 230, respectively. The first and second wiring patterns 222 and 232 may be electrically connected through the contact plugs BCP to the transistors.

An optical transmission layer 30 may be formed on the second surface 100b of the substrate 100. For example, an antireflection layer 310 and a first passivation layer 312 may be sequentially formed on the second surface 100b of the substrate 100. A grid pattern 315 may be formed on the first passivation layer 312, and may vertically overlap (e.g., in the third direction D3) the deep isolation pattern 150. The formation of the grid pattern 315 may include, for example, depositing a metal layer on the first passivation layer 312 and patterning the metal layer. Color filters CF may be formed on the first passivation layer 312 to cover the grid pattern 315. The color filters CF may be correspondingly disposed on the pixel sections PX. A second passivation layer 322 may be formed on the color filters CF, and microlenses 330 may be formed on the second passivation layer 322.

FIGS. 10 to 14 and 17 illustrate cross-sectional views taken along line I-I' of FIG. 3, showing a method of fabricating an image sensor according to some embodiments of the present inventive concept. A duplicate description will be omitted below.

Figure 17:
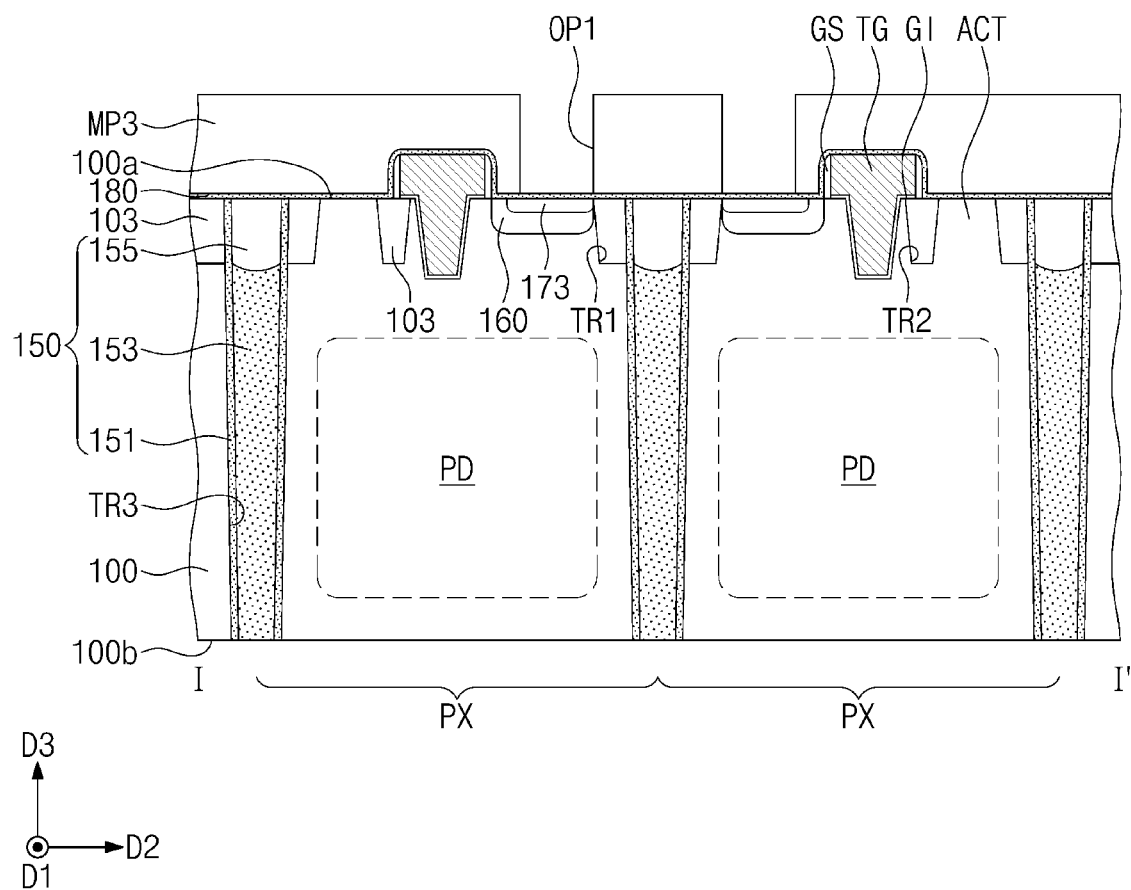
FIG. 17 illustrates a cross-sectional view taken along line I-I' of FIG. 3, showing a method of fabricating an image sensor according to an embodiment of the present inventive concept.

Referring to FIGS. 3 and 17 together with FIG. 14, the first surface 100a of the substrate 100 may undergo an additional implantation process to form an additional impurity region 173. The additional impurity region 173 may be formed on the impurity region 160. For example, the additional implantation process may include forming a third mask pattern MP3 on the first surface 100a of the substrate 100 and using the third mask pattern MP3 to dope additional impurities into the first surface 100a of the substrate 100. In an embodiment, the additional impurities may include, for example, at least one selected from carbon (C) and germanium (Ge).

However, embodiments of the present inventive concept are not necessarily limited thereto. For example, in an embodiment the etch stop layer 180 may be partially removed which will be discussed below, the third mask pattern MP3 may be removed, and thereafter the additional impurity region 173 may be formed.

An etching process may be performed to partially remove the etch stop layer 180 exposed to the first opening OP1. A description of the etching process may be substantially the same as that discussed above with reference to FIGS. 3 and 15.

The third mask pattern MP3 may be removed. A doping pad 170 may be formed on the first surface 100a of the substrate 100. The formation of the doping pad 170 may be substantially the same as that discussed above with reference to FIGS. 3 and 16. Therefore, the doping pad 170 may be formed on the additional impurity region 173. The processes mentioned above may form a photoelectric conversion layer 10.

A wiring layer 20 may be formed on the first surface 100a of the substrate 100. An optical transmission layer 30 may be formed on the second surface 100b of the substrate 100. The formation of the wiring layer 20 and the optical transmission layer 30 may be substantially the same as that discussed above with reference to FIGS. 3, 4, and 5.

FIGS. 10 to 15, 18, and 19 illustrate cross-sectional views taken along line I-I' of FIG. 3, showing a method of fabricating an image sensor according to some embodiments of the present inventive concept. A duplicate description will be omitted below.

Figure 18:
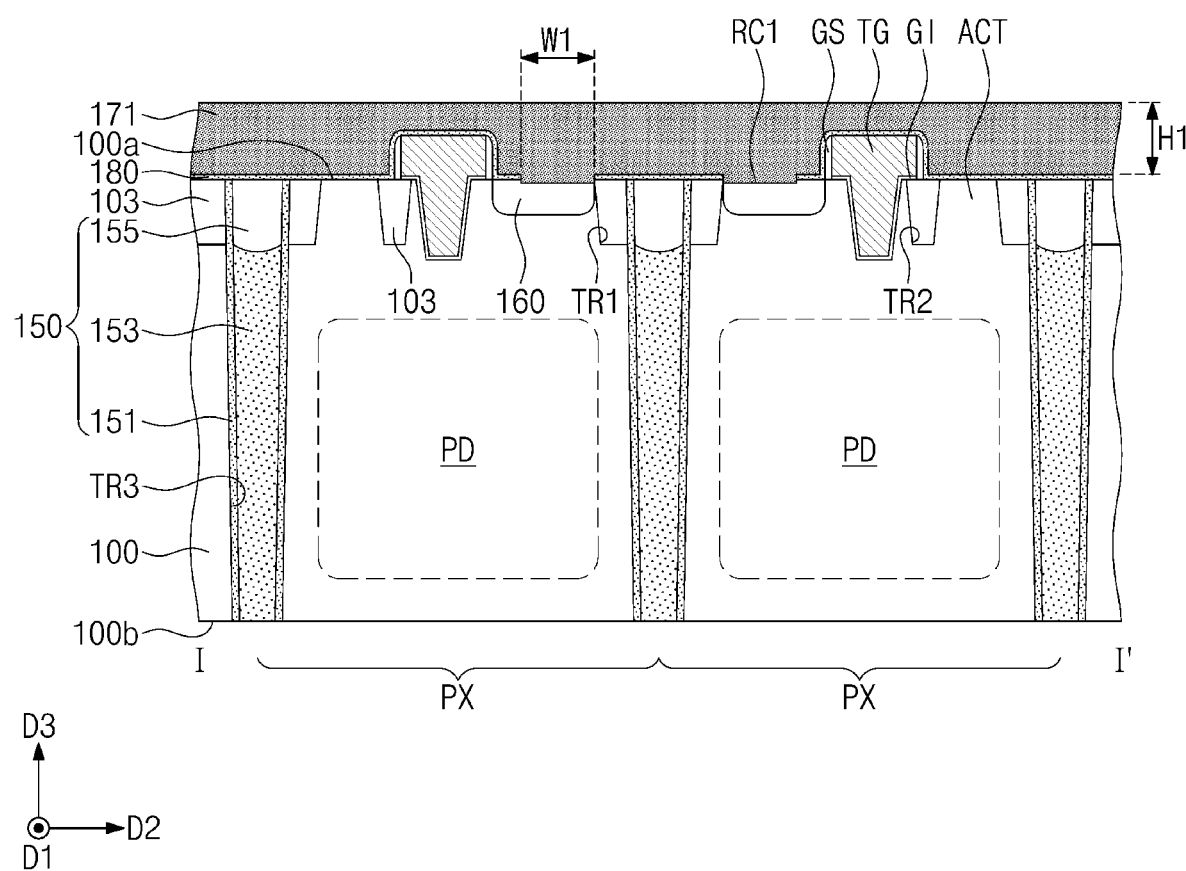
FIGS. 18 and 19 illustrate cross-sectional views taken along line I-I' of FIG. 3, showing a method of fabricating an image sensor according to some embodiments of the present inventive concept.

Referring to FIGS. 3 and 18 together with FIG. 15, the third mask pattern MP3 may be removed. A polysilicon layer 171 may be formed on the first surface 100a of the substrate 100. The polysilicon layer 171 may cover the gate electrode TG and the first surface 100a of the substrate 100, and may fill the recess RC1 of the substrate 100. For example, the polysilicon layer 171 may have a height H1 greater than half a width W1 of the recess RC1. In this description, the term "height" may indicate a distance measured in a direction (e.g., the third direction D3) perpendicular to the second surface 100b of the substrate 100. In an embodiment, the polysilicon layer 171 may include, for example, doped polysilicon.

Figure 19:
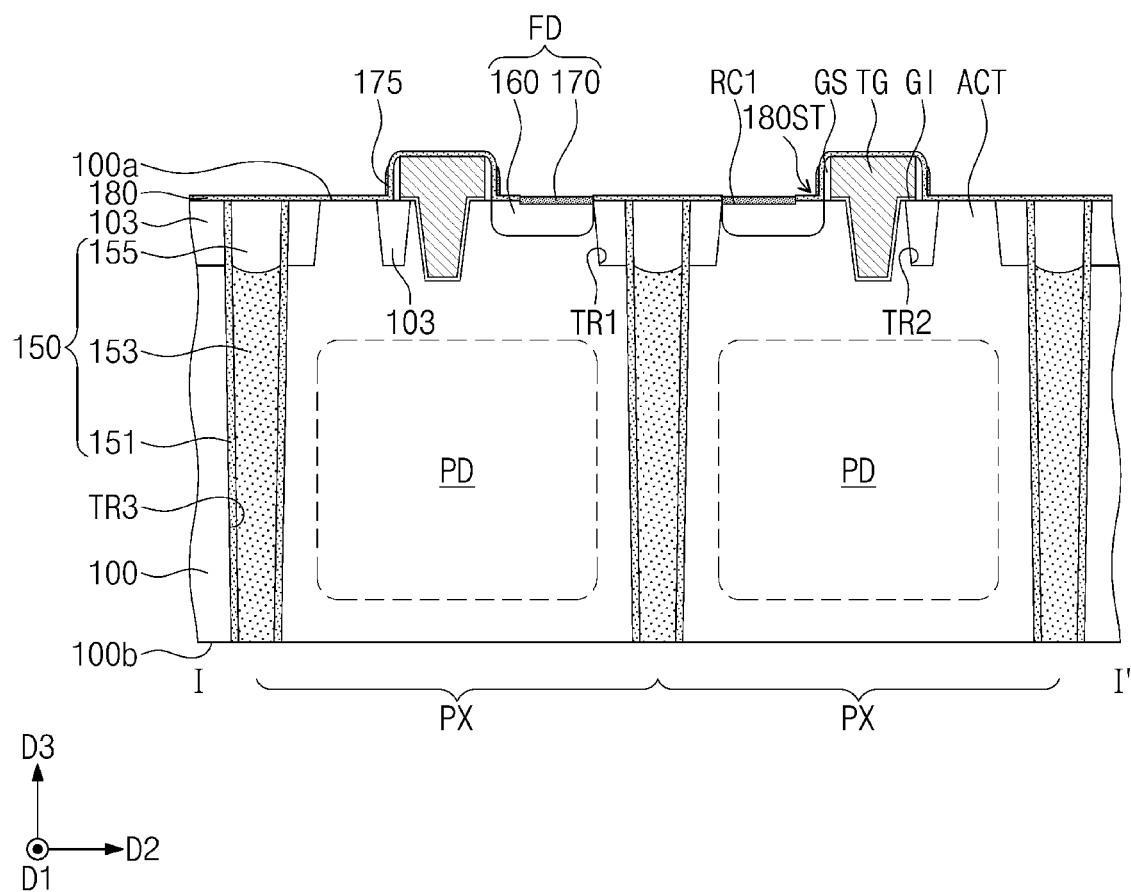

Referring to FIGS. 3 and 19, the polysilicon layer 171 may undergo an etching process to form a doping pad 170 and a dummy pattern 175. In the etching process, a portion of the polysilicon layer 171 may remain in the recess RC1 to form the doping pad 170. In the etching process, another portion of the polysilicon layer 171 may remain on the stepped part 180ST of the etch stop layer 180 provided between the gate electrode TG and the impurity region 160.

In some embodiments, second impurities may further be doped into the first surface 100a of the substrate 100. The second impurities may include, for example, at least one compound selected from phosphorus (P) and arsenic (As). The doping pad 170 and the dummy pattern 175 may include, for example, polysilicon doped with n-type impurities. The doping pad 170 and the dummy pattern 175 may include, for example, polysilicon doped with at least one impurity selected from phosphorus (P) and arsenic (As). A concentration of the second impurities in the doping pad 170 may be greater than a concentration of the first impurities in the impurity region 160.

After the formation of the doping pad 170, an annealing process may further be performed. The annealing process may be, for example, a rapid thermal annealing (RTA) process.

In some embodiments, before a portion of the etch stop layer 180 is etched, an additional impurity region 173 may further be formed on the impurity region 160. The formation of the additional impurity region 173 may be substantially the same as that discussed above with reference to FIGS. 3 and 17. The processes mentioned above may form a photoelectric conversion layer 10.

A wiring layer 20 may be formed on the first surface 100a of the substrate 100. An optical transmission layer 30 may be formed on the second surface 100b of the substrate 100. The formation of the wiring layer 20 and the optical transmission layer 30 may be substantially the same as that discussed above with reference to FIGS. 3, 4, and 5.

Figure 20:
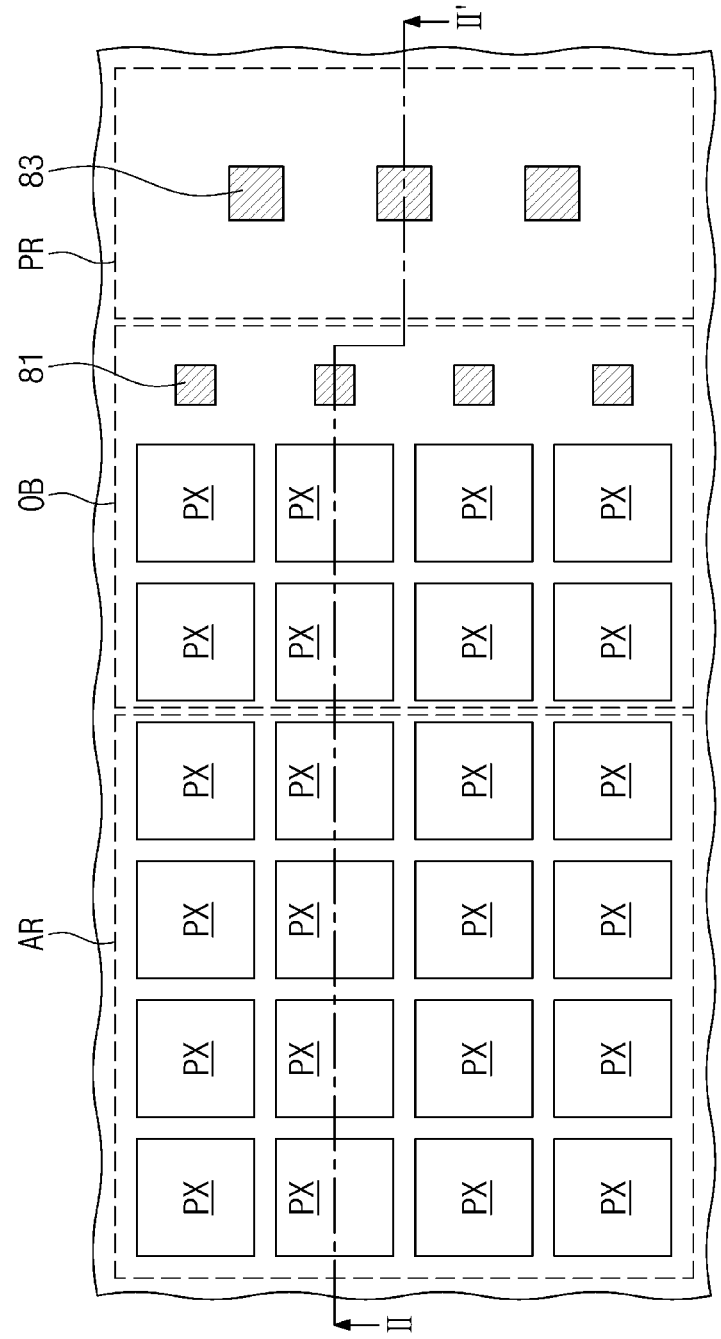
FIG. 20 illustrates a plan view showing an image sensor according to an embodiment of the present inventive concept.
Figure 21:
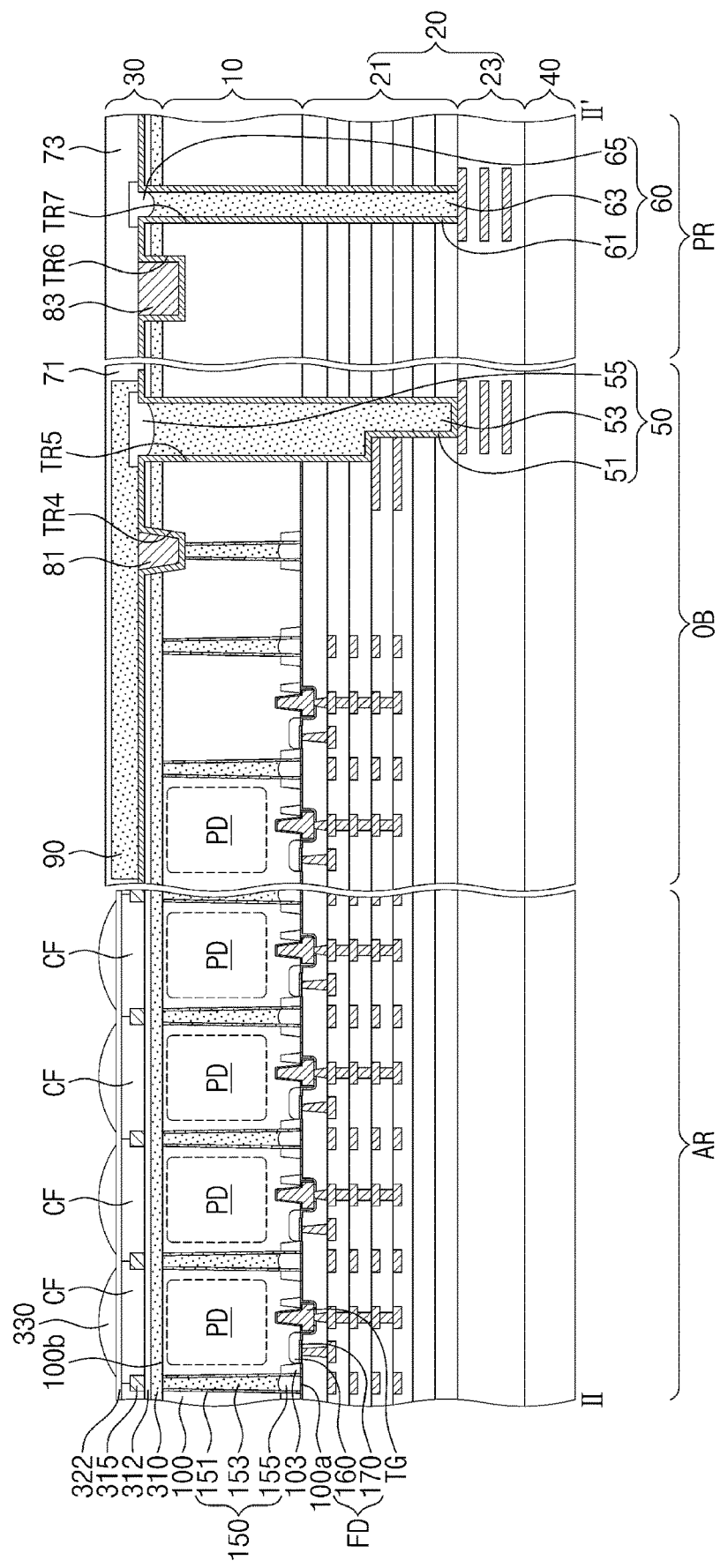
FIG. 21 illustrates a cross-sectional view taken along line II-II' of FIG. 20, showing an image sensor according to an embodiment of the present inventive concept.

FIG. 20 illustrates a plan view showing an image sensor according to some embodiments of the present inventive concept. FIG. 21 illustrates a cross-sectional view taken along line II-II' of FIG. 20, showing an image sensor according to some embodiments of the present inventive concept. A duplicate description of identical or similar elements may be omitted below for convenience of explanation.

Referring to FIGS. 20 and 21, an image sensor may include a substrate 100 including a pixel array area AR, an optical black area OB, and a pad area PR, a wiring layer 20 on a first surface 100a of the substrate 100, a base substrate 40 on the wiring layer 20, and an optical transmission layer 30 on a second surface 100b of the substrate 100. The wiring layer 20 may be disposed between the base substrate 40 and the first surface 100a of the substrate 100 (e.g., in the third direction D3). The wiring layer 20 may include an upper wiring layer 21 adjacent to the first surface 100a of the substrate 100, and may also include a lower wiring layer 23 between the upper wiring layer 21 and the base substrate 40 (e.g., in the third direction D3). The pixel array area AR may include a plurality of pixel sections PX, a deep isolation pattern 150 disposed between the plurality of pixel sections PX, and a floating diffusion region FD disposed adjacent to the first surface 100a of the substrate 100. The floating diffusion region FD may be disposed on one side of the gate electrode TG. The floating diffusion region FD may include an impurity region 160 and a doping pad 170. The pixel array area AR may be configured substantially identical to the image sensor discussed above with reference to FIGS. 1 to 5. For example, the impurity region 160 and the doping pad 170 may be respectively substantially the same as the impurity region 160 and the doping pad 170 that are discussed above with reference to FIGS. 1 to 5.

A first connection structure 50, a first contact 81, and a bulk color filter 90 may be disposed on the optical black area OB of the substrate 100. The first connection structure 50 may include a first light-shield pattern 51, a first separation pattern 53, and a first capping pattern 55. The first light-shield pattern 51 may be disposed on the second surface 100b of the substrate 100. The first light-shield pattern 51 may cover the first passivation layer 312, and may conformally cover an inner wall of each of fourth and fifth trenches TR4 and TR5. The first light-shield pattern 51 may penetrate the photoelectric conversion layer 10 and the upper wiring layer 21. The first light-shield pattern 51 may be connected to the deep isolation pattern 150 of the photoelectric conversion layer 10, and may be connected to wiring lines in the upper and lower wiring layers 21 and 23. Therefore, the first connection structure 50 may electrically connect the photoelectric conversion layer 10 to the wiring layer 20. The first light-shield pattern 51 may include a metallic material (e.g., tungsten). The first light-shield pattern 51 may block light that is incident on the optical black area OB.

The first contact 81 may fill an unoccupied portion of the fourth trench TR4. In an embodiment, the first contact 81 may include a metallic material (e.g., aluminum). The first contact 81 may be connected to the deep isolation pattern 150. The first separation pattern 53 may fill an unoccupied portion of the fifth trench TR5. The first separation pattern 53 may penetrate the photoelectric conversion layer 10 and a portion of the wiring layer 20. The first separation pattern 53 may include a dielectric material. The first capping pattern 55 may be disposed on the first separation pattern 53 (e.g., directly thereon in the third direction D3).

The bulk color filter 90 may be disposed on (e.g., disposed directly thereon) the first connection structure 50 and the first contact 81. The bulk color filter 90 may cover the first connection structure 50 and the first contact 81. A first protection layer 71 may be disposed on and encapsulate the bulk color filter 90.

A photoelectric conversion region PD may be provided in a corresponding pixel section PX on the optical black area OB. The photoelectric conversion region PD on the optical black area OB may be doped with impurities. The photoelectric conversion region PD on the optical black area OB may be a region having a second conductivity type (e.g., n-type) different from a first conductivity type of the substrate 100. In an embodiment, the photoelectric conversion region PD on the optical black area OB may have a structure similar to the structure of the photoelectric conversion regions PD on the pixel array area AR, but may not perform the same operation (e.g., generation of electrical signals from received light) as that of the photoelectric conversion regions PD on the pixel array area AR.

A second connection structure 60, a second contact 83, and a second protection layer 73 may be disposed on the pad area PR of the substrate 100. The second connection structure 60 may include a second light-shield pattern 61, a second separation pattern 63, and a second capping pattern 65.

The second light-shield pattern 61 may be disposed on the second surface 100b of the substrate 100. The second light-shield pattern 61 may cover the first passivation layer 312, and may conformally cover an inner wall of each of sixth and seventh trenches TR6 and TR7. The second light-shield pattern 61 may penetrate the photoelectric conversion layer 10 and the upper wiring layer 21. The second light-shield pattern 61 may be connected to wiring lines in the lower wiring layer 23. Therefore, the second connection structure 60 may electrically connect the photoelectric conversion layer 10 to the wiring layer 20. The second light-shield pattern 61 may include a metallic material (e.g., tungsten). The second light-shield pattern 61 may block light that is incident on the pad area PR.

The second contact 83 may fill an unoccupied portion of the sixth trench TR6. In an embodiment, the second contact 83 may include a metallic material (e.g., aluminum). The second contact 83 may serve as an electrical connection path between the image sensor and an external device. The second separation pattern 63 may fill an unoccupied portion of the seventh trench TR7. The second separation pattern 63 may penetrate the photoelectric conversion layer 10 and a portion of the wiring layer 20. The second separation pattern 63 may include a dielectric material. The second capping pattern 65 may be disposed on the second separation pattern 63 (e.g., disposed directly thereon in the third direction D3). The second protection layer 73 may cover the second connection structure 60.

A current applied through the second contact 83 may flow toward the deep isolation pattern 150 through the second light-shield pattern 61, the wiring lines in the wiring layer 20, and the first light-shield pattern 51. Electrical signals generated from the photoelectric conversion regions PD in the plurality of pixel sections PX on the pixel array area AR may be outwardly transferred through the wiring lines in the wiring layer 20, the second light-shield pattern 61, and the second contact 83.

According to an embodiment of the present inventive concept, a floating diffusion region may include a doping pad doped with high-concentration impurities, and the doping pad may be horizontally and vertically spaced apart from a lower portion of a gate electrode that is inserted into a substrate. An increase in horizontal and vertical distances between the gate electrode and the doping pad may prevent gate induced drain leakage (GIDL) phenomena that occur between the gate electrode and the doping pad.

According to some embodiments of the present inventive concept, the floating diffusion region may further include an additional impurity region interposed between an impurity region and the doping pad. The additional impurity region may prevent impurities in the doping pad from being diffused or introduced into the substrate. In addition, the additional impurity region may prevent metal atoms in a contact plug from being diffused or introduced into the substrate.

Although the present inventive concept have been described in connection with the some non-limiting embodiments illustrated in the accompanying drawings, it will be understood by one of ordinary skill in the art that variations in form and detail may be made therein without departing from the spirit and essential feature of the present inventive concept. Therefore, the above disclosed embodiments should thus be considered illustrative and not restrictive.

What is claimed is:

1. An image sensor, comprising:
   a substrate including a plurality of pixel sections, the substrate having a first surface and a second surface that are opposite to each other;
   a photoelectric conversion region in each of the pixel sections;
   a first isolation trench disposed in the substrate and positioned between the pixel sections, the first isolation trench comprises a dielectric pattern that is in contact with the first surface of the substrate, a separation pattern disposed on a sidewall of the first isolation trench, and a pattern on the separation pattern;
   a gate electrode comprising a lower portion inserted into the substrate and an upper portion protruding beyond the first surface of the substrate;
   a floating diffusion region on the photoelectric conversion region positioned on one side of the gate electrode; and
   a contact plug connected to the floating diffusion region,
   wherein the floating diffusion region includes a doping pad on the first surface and a first impurity region on the doping pad, the first impurity region surrounds a lower portion of the doping pad,
   wherein the contact plug is connected to an upper portion of the doping pad, the upper portion of the doping pad is opposing the lower portion of the doping pad, and
   wherein the contact plug, the doping pad, and the first impurity region are vertically arranged.

2. The image sensor of claim 1, wherein a height of the doping pad from the first surface of the substrate to the lower portion of the doping pad in a first direction perpendicular to the first surface of the substrate is smaller than a height of the first impurity region from the first surface of the substrate to a lower portion of the first impurity region in the first direction.

3. The image sensor of claim 2, wherein the upper portion of the doping pad is at a level that is higher than a level of the first surface of the substrate.

4. The image sensor of claim 2, wherein the separation pattern comprises metal oxide.

5. The image sensor of claim 2, wherein the height of the first impurity region from the first surface of the substrate to a lower portion of the first impurity region in the first direction is smaller than a height of the dielectric pattern from the first surface of the substrate to a lower portion of the dielectric pattern in the first direction.

6. The image sensor of claim 5, wherein the dielectric pattern comprises silicon oxide.

7. The image sensor of claim 6, wherein a lower portion of the dielectric pattern has an uneven shape, and
   wherein the lower portion of the dielectric pattern is spaced apart from the first surface of the substrate.

8. The image sensor of claim 2, wherein the height of the first impurity region from the first surface of the substrate to a lower portion of the first impurity region in the first direction is smaller than a height of the gate electrode from the first surface of the substrate to the lower portion of the gate electrode in the first direction.

9. The image sensor of claim 2, wherein the doping pad includes at least one selected from doped epitaxial silicon and doped polysilicon.

10. The image sensor of claim 1, wherein the first impurity region fully surrounds a lower portion of the doping pad.

11. The image sensor of claim 10, further comprises:
    a device isolation layer on the first surface of the substrate and disposed adjacent to the first isolation trench.

12. An image sensor, comprising:
    a substrate having a first surface and a second surface that are opposite to each other;
    a first isolation trench disposed in the substrate and positioned between the pixel sections, the first isolation trench comprises a dielectric pattern that is in contact with the first surface of the substrate, a separation pattern disposed on a sidewall of the first isolation trench, and a pattern on the separation pattern; a photoelectric conversion region in the pixel section;
    a gate electrode comprising a lower portion inserted into the substrate and an upper portion protruding beyond the first surface of the substrate;
    a floating diffusion region on the photoelectric conversion region, the floating diffusion region is positioned on one side of the gate electrode;
    a contact plug connected to the floating diffusion region,
    wherein the floating diffusion region includes an impurity region and a doping pad disposed on the impurity region,
    wherein the contact plug, the doping pad, and the impurity region are vertically arranged,
    wherein a lower portion of the dielectric pattern has an uneven shape,
    wherein the first isolation trench is in contact with the first surface of the substrate and the second surface of the substrate, and
    wherein the lower portion of the dielectric pattern is spaced apart from the first surface of the substrate.

13. The image sensor of claim 12, wherein:
    the substrate has a first conductivity type; and
    each of the impurity region and the doping pad has a second conductivity type that is different from the first conductivity type.

14. The image sensor of claim 12, wherein a height of the doping pad from the first surface of the substrate to the lower portion of the doping pad in a first direction perpendicular to the first surface of the substrate is smaller than a height of the impurity region from the first surface of the substrate to a lower portion of the impurity region in the first direction.

15. The image sensor of claim 12, wherein the impurity region fully surrounds a lower portion of the doping pad.

16. The image sensor of claim 15, wherein a width of the doping pad in a second direction parallel to the first surface of the substrate is smaller than a width of the impurity region in the second direction.

17. The image sensor of claim 15, wherein an upper portion of the doping pad is at a level that is higher than a level of the first surface of the substrate, and
wherein the upper portion of the doping pad is opposite to the lower portion of the doping pad.

18. An image sensor, comprising:
a substrate that has a first surface and a second surface that are opposite to each other;
a first isolation trench disposed in the substrate and positioned between the pixel sections, the first isolation trench comprises a dielectric pattern that is in contact with the first surface of the substrate, a separation pattern disposed on a sidewall of the first isolation trench, and a pattern on the separation pattern; a photoelectric conversion region in the pixel section;
a gate electrode comprising a lower portion inserted into the substrate and an upper portion protruding beyond the first surface of the substrate;
a floating diffusion region on the photoelectric conversion region, the floating diffusion region is positioned on one side of the gate electrode, the floating diffusion region including an impurity region and a doping pad on the impurity region;
a contact plug on the first surface of the substrate and electrically connected to the doping pad;
a microlens on the second surface of the substrate; and
a plurality of color filters between the substrate and the microlens,
wherein the contact plug, the doping pad, and the impurity region are vertically arranged, and wherein the impurity region fully surrounds a lower portion of the doping pad.

19. The image sensor of claim 18, wherein a width of the doping pad in a first direction parallel to the first surface of the substrate is smaller than a width of the impurity region in the first direction.

20. The image sensor of claim 19, wherein a height of the doping pad from the first surface of the substrate to the lower portion of the doping pad in a second direction perpendicular to the first direction is smaller than a height of the impurity region from the first surface of the substrate to a lower portion of the impurity region in the second direction.

* * * * *